US006967605B2

(12) United States Patent
Fujihara et al.

(10) Patent No.: US 6,967,605 B2
(45) Date of Patent: Nov. 22, 2005

(54) IMAGE READING APPARATUS AND METHOD OF DETERMINING GAIN VALUE AND OFFSET VALUE FOR IMAGE READING APPARATUS

(75) Inventors: Hideya Fujihara, Nirasaki (JP); Hikaru Ootsuka, Yamanashi-ken (JP)

(73) Assignee: Nisca Corporation, Yamanashi-Ken (JP)

(*) Notice: Subject to any disclaimer, the term of this patent is extended or adjusted under 35 U.S.C. 154(b) by 0 days.

(21) Appl. No.: 10/901,330

(22) Filed: Jul. 29, 2004

(65) Prior Publication Data

US 2005/0024246 A1 Feb. 3, 2005

(30) Foreign Application Priority Data

Jul. 29, 2003 (JP) ............................. 2003-282215
Jul. 29, 2003 (JP) ............................. 2003-282216

(51) Int. Cl.$^7$ ............................................. H03M 1/00
(52) U.S. Cl. ..................................... 341/139; 341/153
(58) Field of Search ....................... 341/137, 119, 165, 341/155, 120, 122, 139, 153

(56) References Cited

U.S. PATENT DOCUMENTS

| 4,592,002 A | * | 5/1986 | Bozarth et al. ............. 702/107 |
| 5,764,891 A | * | 6/1998 | Warrior ....................... 710/72 |
| 5,874,909 A | * | 2/1999 | Soenen et al. .............. 341/141 |
| 5,909,188 A | * | 6/1999 | Tetzlaff et al. ............. 341/155 |
| 6,903,670 B1 | * | 6/2005 | Lee et al. .................... 341/118 |

OTHER PUBLICATIONS

Patent Abstract of Japan; Publication No. 10-2339903; Publication Date Sep. 2, 1998; Applicant Canon Inc.

* cited by examiner

*Primary Examiner*—Peguy JeanPierre
*Assistant Examiner*—Joseph Lauture
(74) *Attorney, Agent, or Firm*—Manabu Kanesaka

(57) ABSTRACT

An image reading apparatus includes a light source for irradiating an original; a photoelectric converter for converting light reflected from the original to an analog signal; an A/D converter for converting the analog signal corresponding to each pixel from the photoelectric converter to the digital signal; and an adjusting device connected between the photoelectric converter and the A/D converter for performing an offset processing and a gain processing of the analog signal from the photoelectric converter. A memory stores a relational formula representing a correlation between an offset value for the offset processing and a gain value for the gain processing. An offset value calculating device obtains an offset value corresponding to a gain value used in the gain processing of the analog signal by using the gain value and the relational formula stored in the memory.

11 Claims, 19 Drawing Sheets

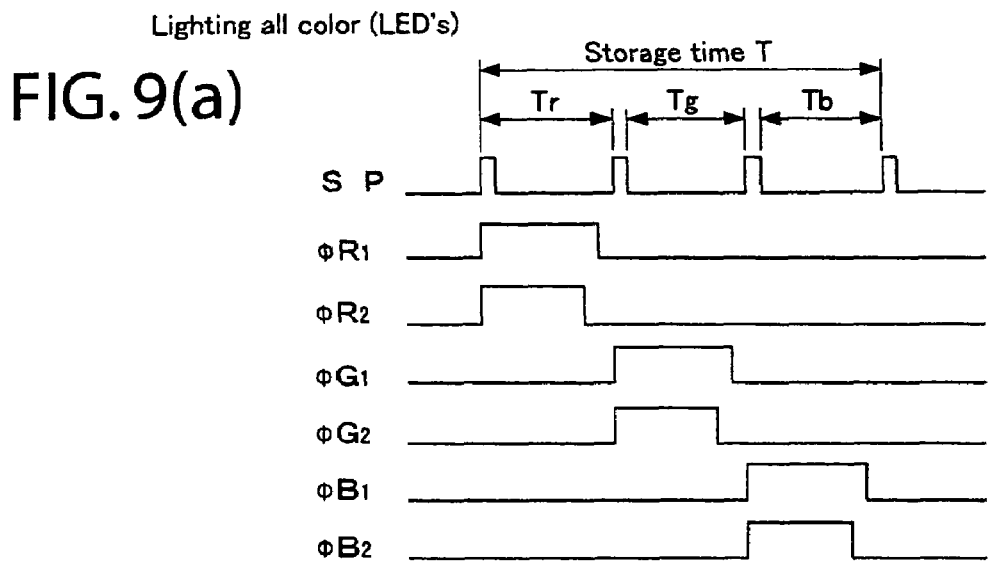
FIG. 9(a) Lighting all color (LED's)
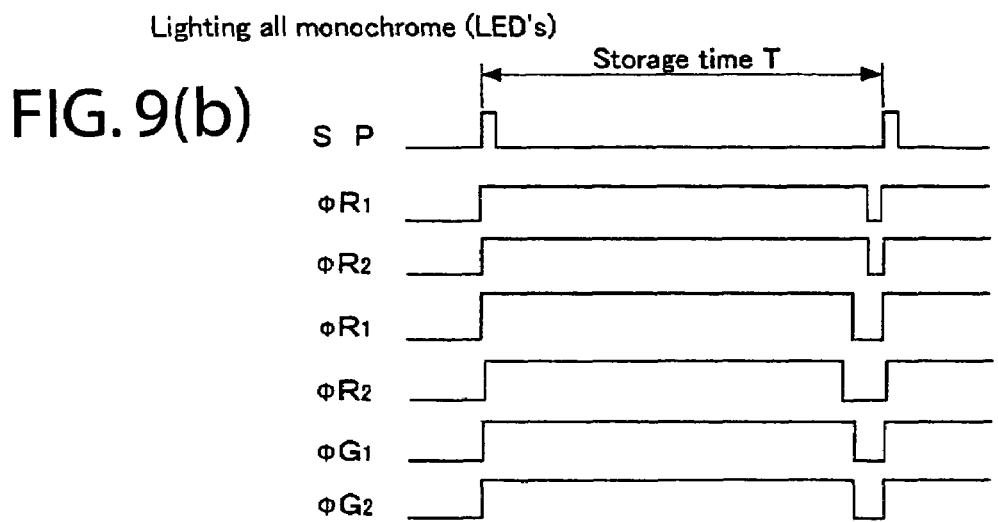
FIG. 9(b) Lighting all monochrome (LED's)
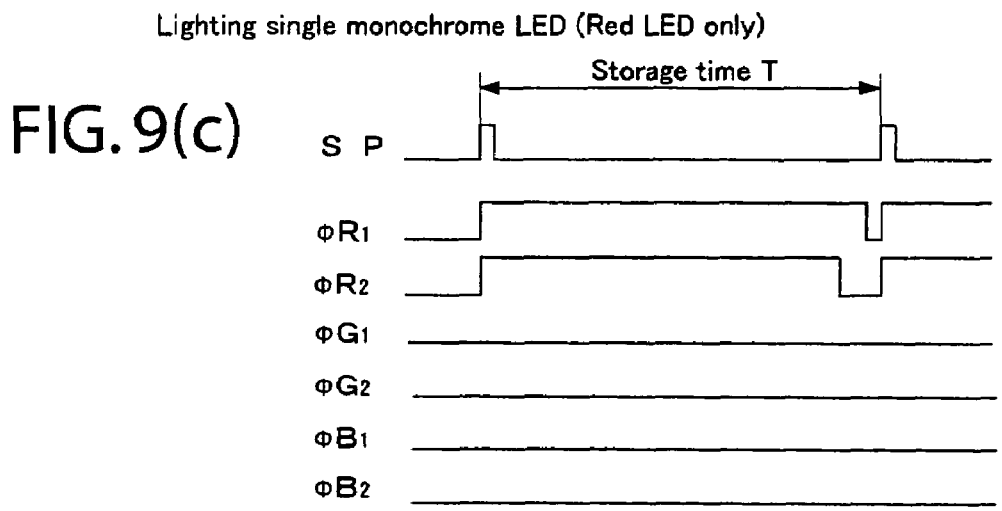
FIG. 9(c) Lighting single monochrome LED (Red LED only)

IMAGE READING APPARATUS AND METHOD OF DETERMINING GAIN VALUE AND OFFSET VALUE FOR IMAGE READING APPARATUS

BACKGROUND OF THE INVENTION AND RELATED ART STATEMENT

The present invention relates to an image reading apparatus for optically reading an original and a method of determining a gain value and an offset value for the image reading apparatus, especially a method of determining a gain value and an offset value in a short period of time.

A signal processing section of a conventional image reading apparatus mounted on a copy machine or a facsimile is schematically illustrated in FIG. 19. As shown in FIG. 19, an original or a reference white plate is irradiated with light, and light reflected from the original or the reference white plate is converted to an analog signal by a linear sensor 1000 comprising a plurality of photoelectric conversion elements. The analog signal outputted from the sensor 1000 is inputted to an adjusting circuit 1002 via a sample hold circuit 1001 for gain processing and offset processing in the adjusting circuit, and an A/D converter 1003 converts to a digital signal. After an image processor 1004 performs various image-processing such as shading correction and gamma correction, the digital signal is outputted as an image data to an external apparatuses such as a printer.

In the gain processing and the offset processing performed at the adjusting circuit, as disclosed in Japanese Patent Publication No. 10-233903, a voltage of the analog signal is adjusted to be within a resolution range of the A/D converter, so that proper graduation is obtained according to the resolution of the A/D converter. That is, the analog signal is amplified in the gain processing, and a dark current value is lowered in the offset processing. A gain value for the gain processing and an offset value for the offset processing are set in a first register 1005 and a second register 1006, respectively. It is necessary to set these values each time the apparatus is turned on or the original is scanned.

A conventional method of setting the gain value and the offset value will be described below. FIG. 11 is a graph for explaining the resolution of the A/D converter. The A/D converter shown in FIG. 11 has an input voltage range of about 0 to 5 V and the resolution of 10 bits (resolution: 1024 levels from 0 through 1023). A threshold value L2 is set to be a level where an output value of the A/D converter becomes close to the maximum resolution 1023, and a threshold value L1 is set to be a level where the output value of the A/D converter becomes close to the minimum resolution 0. Incidentally, the offset value settable in the first register 1005 and the gain value settable in the second register 1006 are 8 bits (0 to 255).

An offset adjustment for determining the offset value is performed as follows. First, an offset value 0 is set in the register 1005, and a gain value 0 is set in the second register 1006. While a light source is turned off, the reference white plate in a scanning unit of the image reading apparatus is scanned for one line. The analog signal corresponding to the one line is outputted from the sensor 100, and the offset processing and the gain processing are performed based on the offset value 0 in the first register 1005 and the gain value 0 in the second register 1006. The analog signal is then converted to the digital signal by the A/D converter 1003. The digital signal is compared with the threshold value L1 for each pixel in the comparator circuit 1007 to determine whether the digital signal from the A/D converter 1003 has a predetermined level (close to the threshold value L1).

When the digital signal is determined to have the predetermined level, the offset value (0 in this case) set in the first register 1005 is adopted as the predetermined offset value (Of). When the digital signal is determined not to have the predetermined level, these steps are repeated until the predetermined offset value (Of) is obtained while re-writing the offset value in the first register 1005.

Next, a gain adjustment is performed for obtaining the gain value. First, the offset value (Of) obtained through the offset adjustment process is set in the first register 1005, while the gain value 0 is set in the second register 1006. While the light source is turned on, the reference white plate in the scanning unit of the image reading apparatus is scanned for one line. The analog signal corresponding to the one line is outputted from the sensor, and the offset processing based on the offset value (Of) set in the first register 1005 and the gain processing based on the gain value (0) set in the second register 1006 are performed. The analog signal is then converted to the digital signal by the A/D converter 1003. The digital signal is compared with the threshold value L2 for each pixel to determine whether the digital signal has a predetermined level (close to the threshold value L2).

When the digital signal is found to have the predetermined level, the gain value (0 in this case) set in the second register 1006 is adopted as the gain value (Ga). When the digital signal is found not to have the predetermined level, these steps are repeated until the predetermined level is obtained while re-writing the gain value set in the second register 1006.

The gain value (Ga) is obtained through the method described above. However, the dark current increases when the gain value changes. Accordingly, it is necessary to adjust the offset value one more time to obtain the offset value for the gain value (Ga). That is, until the analog signal becomes the predetermined level (close to the threshold value L2) while the light source is turned on to scan the reference white plate, and the analog signal becomes the predetermined level (close to the threshold value L1) while the light source is turned off, it is necessary to repeat the offset adjustment and the gain adjustment.

In the conventional image reading apparatus, when the gain value and the offset value have the setting ranges of 8 bits, it is necessary to re-write the gain value 256 times at most and adjust the offset each time, thereby taking long time for scanning 256×256×1 lines and processing each scan. Accordingly, when the gain adjustment and the offset adjustment are performed upon turning on the power source, it takes long time to start up due to the long initial processing. Further, when the gain adjustment and offset adjustment are performed each time the original is read, a long time is required before scanning the first original.

In view of the problems described above, an object of the present invention is to provide a method of determining the gain value and the offset value in a short period of time, and an image reading apparatus capable of determining the gain value and the offset value in a short period of time.

Further objects and advantages of the invention will be apparent from the following description of the invention.

SUMMARY OF THE INVENTION

To attain the objects described above, according to the present invention, an image reading apparatus comprises a light source for irradiating an original; a photoelectric converter for converting light reflected from the original to an analog signal; an A/D converter for converting the analog signal corresponding to each pixel from the photoelectric converter to the digital signal; adjusting means connected between the photoelectric converter and the A/D converter for performing an offset processing and a gain processing of the analog signal from the photoelectric converter; a memory for storing a relational formula representing a correlation between an offset value for the offset processing and a gain value for the gain processing; and offset value calculating means for obtaining a offset value corresponding to a gain value used in the gain processing of the analog signal by using the gain value and the relational formula stored in the memory.

In the present invention, it is possible to determine the offset value corresponding to the gain value by using the relational formula representing the correlation between the gain value and the offset value. Accordingly, it is not necessary to adjust the offset value every time the gain value changes as in the conventional offset adjustment method, thereby reducing time required for the gain adjustment and the offset adjustment.

According to the present invention, the relational formula may be a linear function including a variable representing the gain value.

According to the present invention, a method determines an offset value and a gain value for an offset processing and a gain processing of an image reading apparatus. The image reading apparatus comprises a light source for irradiating an original or a reference member for obtaining an image signal; photoelectric conversion means for converting light reflected from the original to an analog signal to read the original; an A/D converter for converting the analog signal corresponding to each pixel from the photoelectric converter to a digital signal; and adjusting means connected between the photoelectric conversion means and the A/D converter for performing the offset processing and the gain processing of the analog signal from the photoelectric conversion means. The method includes a step of obtaining a coefficient for a relational formula representing a correlation between the gain value and the offset value, and a step of obtaining the gain value and determining the offset value corresponding to the gain value by using the relational formula with the coefficient.

In a conventional method, in the gain adjustment and offset adjustment for determining the gain value and offset value, the offset adjustment is performed each time the gain value changes, thereby taking a long time. In the present invention, the relational formula representing the correlation between the gain value and the offset value is provided. Accordingly, it is not necessary to adjust the offset value each time the gain value changes, thereby reducing time for the adjustment.

BRIEF DESCRIPTION OF THE DRAWINGS

FIGS. 9(a) to 9(c) are charts showing various reading modes and timing charts thereof;

FIG. 14 is a flowchart of a process for obtaining a gain value Ga and a offset value Of;

DETAILED DESCRIPTION OF PREFERRED EMBODIMENT

Figure 1:
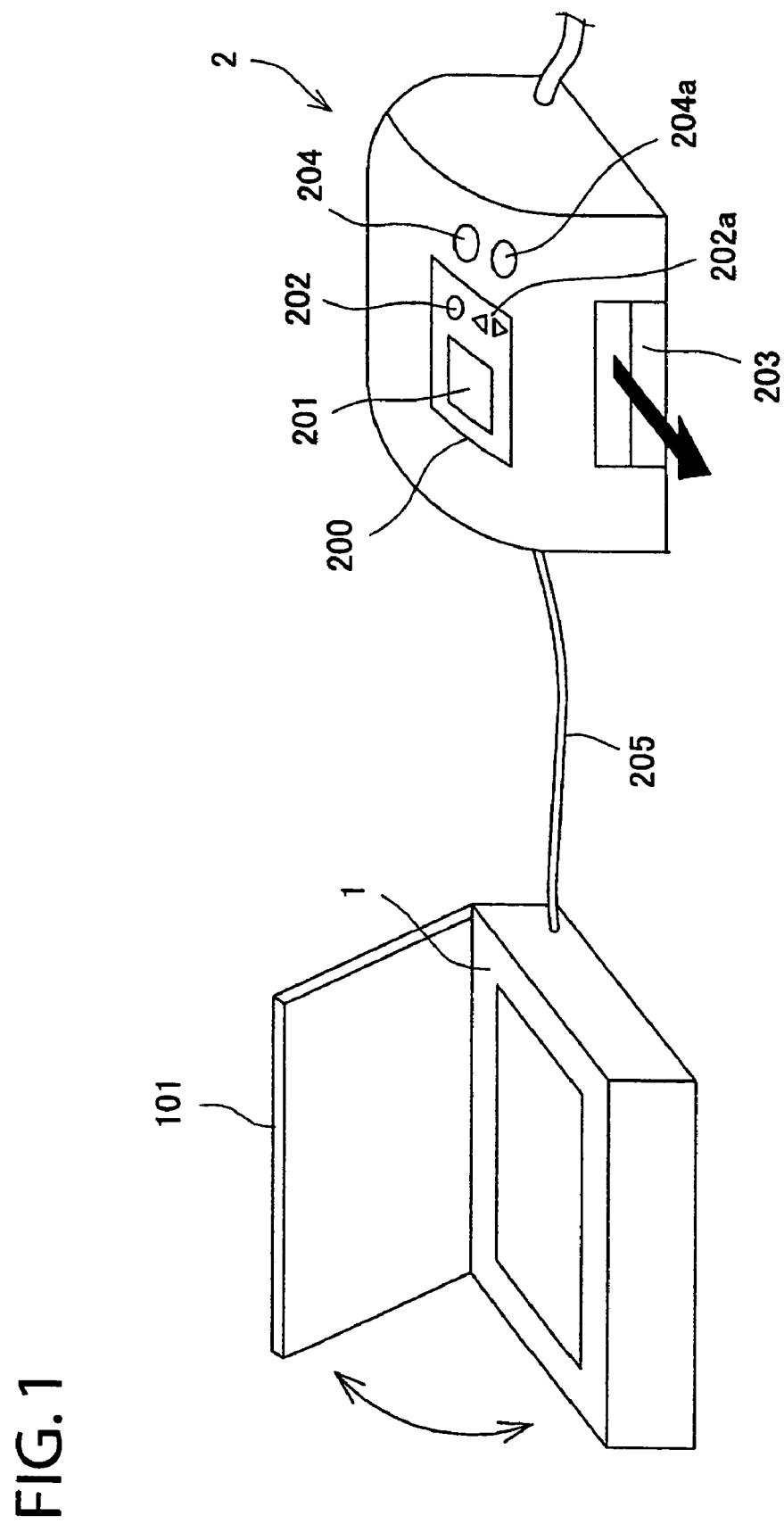
FIG. 1 is a schematic view showing a system comprising an image reading apparatus and a printer for receiving image data from the image reading apparatus to print an image according to an embodiment the present invention.

Hereunder, embodiments of the present invention will be explained with reference to the accompanying drawings. FIG. 1 is a schematic view showing a system comprising an image reading apparatus and a printer for receiving image data from the image reading apparatus to print an image according to an embodiment of the present invention.

An image reading apparatus 1 is directly connected with a printer 2. The printer 2 is an ink-jet printer and is provided on a front part thereof with a control unit 200, a power source switch 204, a copying operation start button 204a, and a sheet ejector 203. The operation unit 200 comprises a display panel 201, an operation button 202a, and an operation button 202b. The operation button 202a and the operation button 202b are used for selecting a resolution (600 dpi/300 dpi) and color (color/monochrome).

The signal corresponding to a reading condition, such as a mode set by the operation unit 200, is transmitted to the image reading apparatus 1 through a cable 205, so that the scanner 1 performs the reading operation upon receiving the signal. The image signal generated by the image reading apparatus 1 is transmitted to the printer 2 through a cable 205, and a sheet such as a postcard with a printed image is ejected from an ejector 203. The image reading apparatus 1 receives power from the printer 2, so that when the printer 2 is turned on by the power switch 204, the image reading apparatus 1 is turned on.

Figure 2A:
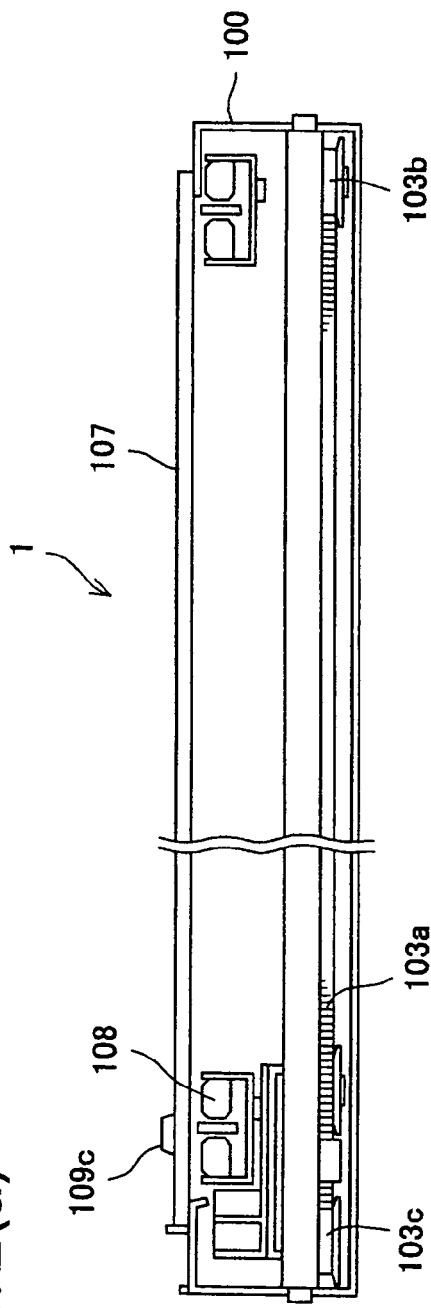
FIGS. 2(a) and 2(b) are views showing an internal structure of the image reading apparatus according to an embodiment of the present invention.
Figure 2B:
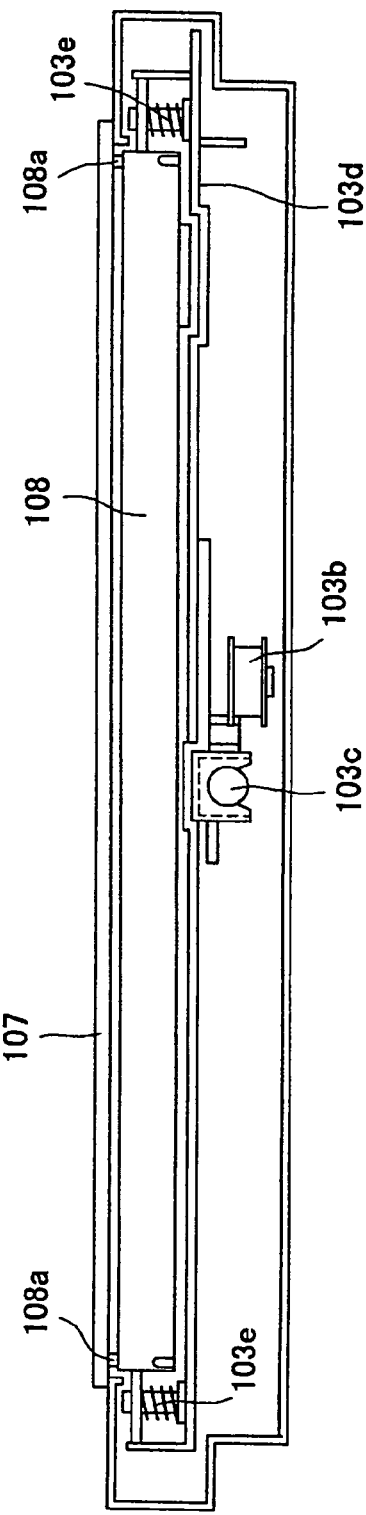

FIGS. 2(a) and 2(b) are views showing an internal structure of the image reading apparatus according to an embodiment of the present invention. The image reading apparatus 1 is mounted on a top opening of a plastic frame 100, and comprises a platen glass 107 for placing an original and an image sensor unit 108 movable along the platen glass 107. The platen glass 107 is provided with a hinged cover 101 to hold the original at a position (refer to FIG. 1). Further, a reference white plate 109c (reference member) is provided for obtaining a reference signal as a reference when gain or shading is adjusted.

Figure 5:
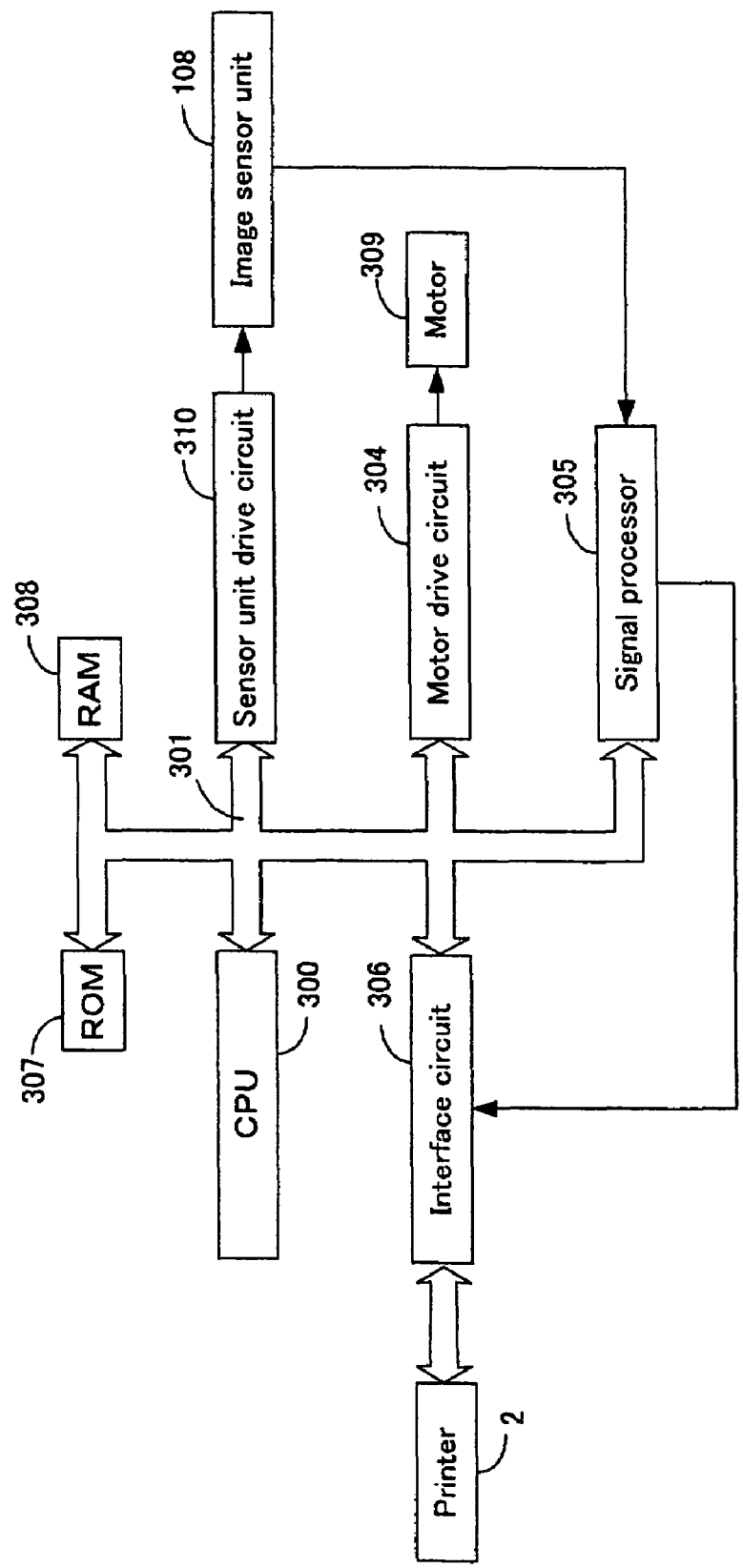
FIG. 5 is a block diagram showing a configuration of the image reading apparatus.

The movable image sensor unit 108 is movable in left and right directions (feeding direction) along a guide shaft 103c to a desired position by means of a timing belt 103a, a drive pulley 103b and a motor 309 (see FIG. 5). In the arrangement, an image sensor unit 108 is supported with the guide shaft 103c and urged upwardly by a spring 103e. A spacer 108a is interposed between an image sensor unit 108 and the platen glass 107. The image sensor unit 108 is designed to be able to travel at a constant speed over a predetermined area wherein the original is read and over the reference white plate 109c during the reading operation.

Figure 3:
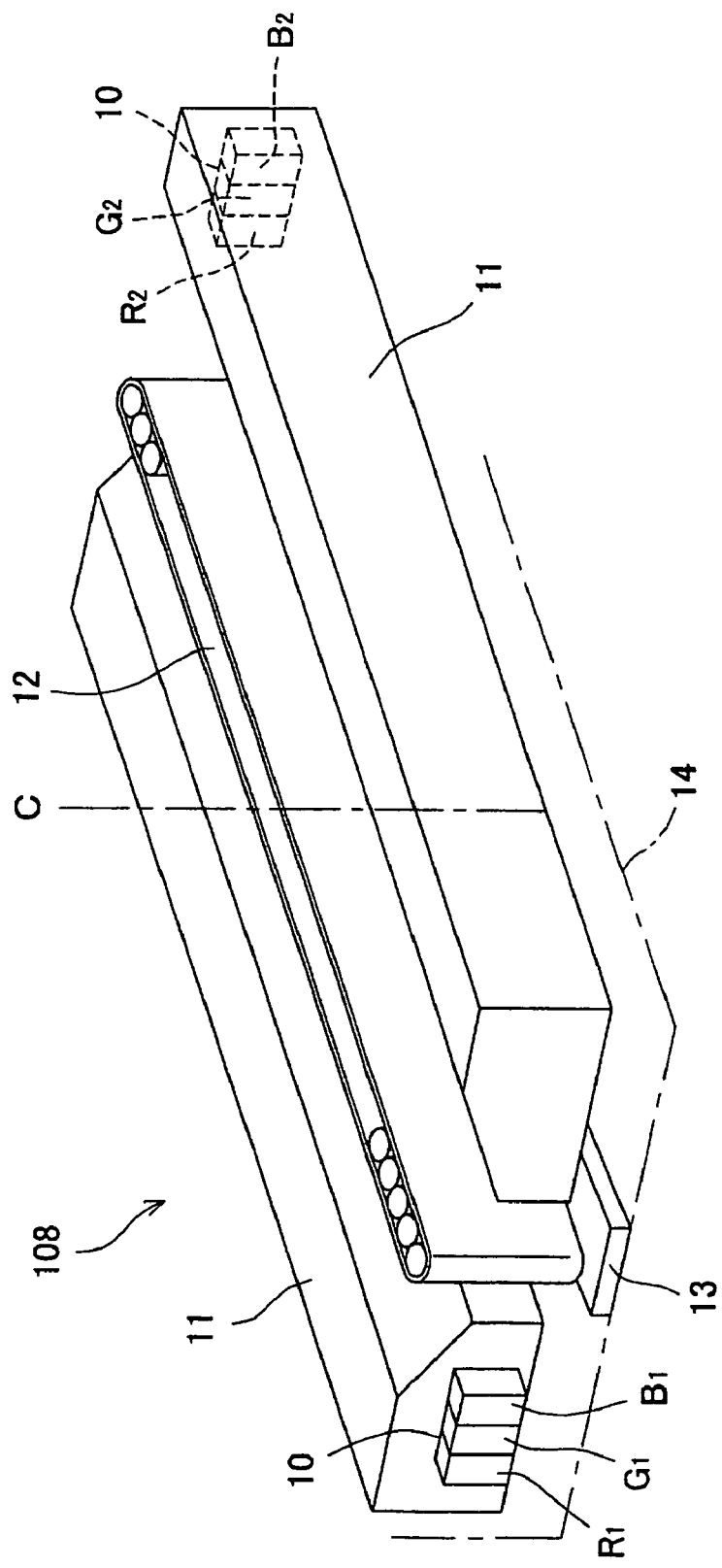
FIG. 3 is a perspective view of an image sensor unit having a light source integrated with a photoelectric converter constituting the image reading apparatus.
Figure 4:
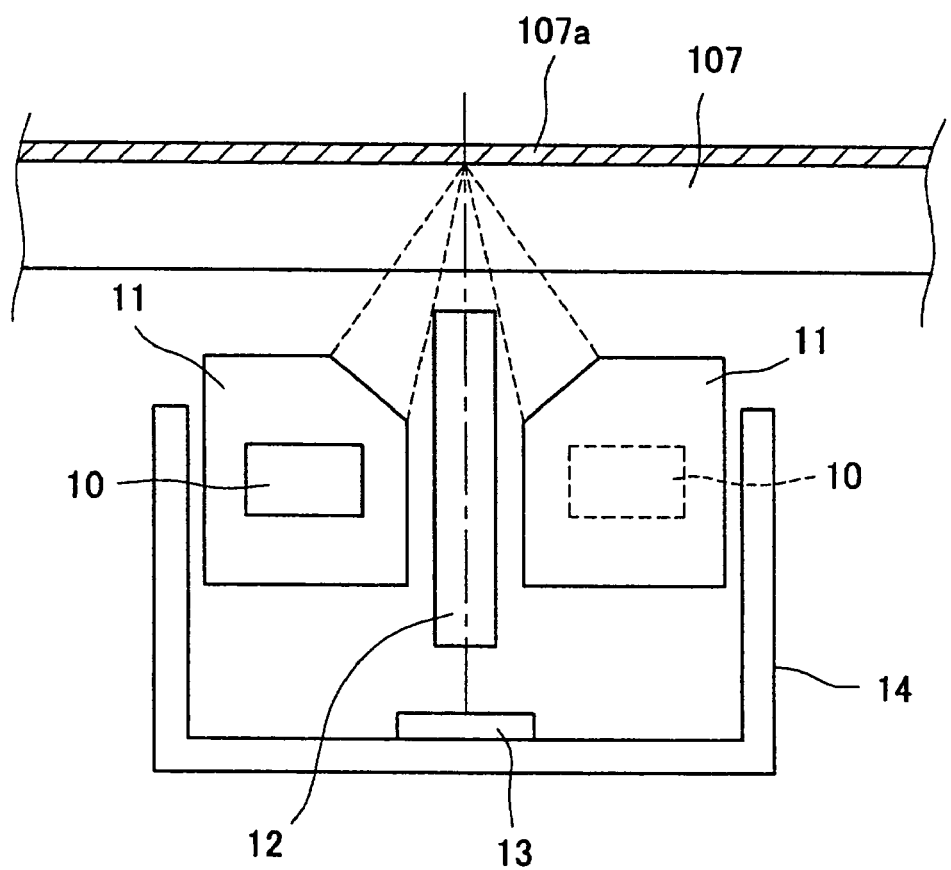
FIG. 4 is a vertical sectional view of the image sensor unit shown in FIG. 3.

FIG. 3 is a perspective view of an image sensor unit having a light source integrated with a photoelectric converter constituting the image reading apparatus. FIG. 4 is a vertical sectional view of the image sensor unit shown in FIG. 3. As shown in FIG. 3 and FIG. 4, the image sensor unit.108 comprises an LED 10 as a light source, and a light guide 11 for guiding light emitted from the LED 10 to the original. A pair of light sources for the light guide is provided along both sides of a SELFOC lens array 12 constituting an imaging optical system. Further, immediately under the SELFOC lens array 12, a sensor 13 formed of a plurality of photoelectric conversion elements (about 2,000) is arranged in line, and each member constituting the image sensor is disposed in a frame 14.

The LEDs 10 are fixed to one of longitudinal ends of the light guides 11. In the embodiment, each of the longitudinal ends of the light guides 11 is provided with three LEDs, i.e. R (red light), G (green light) and B (blue light), respectively. That is, six LEDs (R1, R2, G1, G2, B1, and B2) in total are provided on the longitudinal ends of the optical guides 11. In this fashion, the LEDs are arranged at symmetrical positions relative to a central axis C. Further, the LEDs are turned on and off, and controlled independently from one another.

The LEDs 10 emit light, and light is reflected repetitively through the light guides 11 while advancing, so that the light guides 11 emit light from the whole length thereof. Light emitted from the light guides 11 is irradiated on an original 107a placed on a glass plate 107 and irradiated on the sensor 13 through the SELFOC lens array 12. Accordingly, in the image sensor unit 108, light is irradiated on the original, and light reflected from the original is irradiated on the sensor through the imaging optical system to read the original.

FIG. 5 is a block diagram showing a configuration of the image reading apparatus 1. A CPU 300 (control means) for controlling the image reading apparatus 1 is connected with a sensor unit drive circuit 310 for driving an image sensor unit 108 provided with the sensor 13 and the LEDs 10, a motor drive circuit 304, a signal processor 305, and an interface 306 through a bus line 301. Further, the CPU 300 is connected with a ROM 307 and a R 308 through the bus line 301. The ROM 307 (memory) stores various control programs, such as a lighting control program for the LEDs 10 and a drive control program for the sensor 13, and approximation formulas for obtaining approximate offset values from gain values (described later). The RAM 308 is used for temporarily storing the data for processing the image data. Further, the CPU 300 calculates the offset value from the gain value by using the approximation formula and according to the program stored in the ROM307.

The signal processor 305 executes various image processes such as the gain/offset processing of the analog image signals outputted from the sensor 13, the conversion of the analog signal outputted from the sensor 13 to the digital signal by the A/D converter, the correction of the shading of the digitized image signal, and the like. The processed image signal is connected with an interface 306.

The interface 306 sends and receives data and signals with the printer 2 such as outputting the image data to an external system in the image processing and inputting the signal from the printer 2 according to a reading mode. For instance, the interface 306 complies with the standard such as SCSI or USB and is connected with the printer 2. A motor drive circuit 304 drives a motor 309 to move the image sensor unit 108 in a feeding direction at a predetermined speed according to the reading mode outputted from the printer 2.

Figure 6:
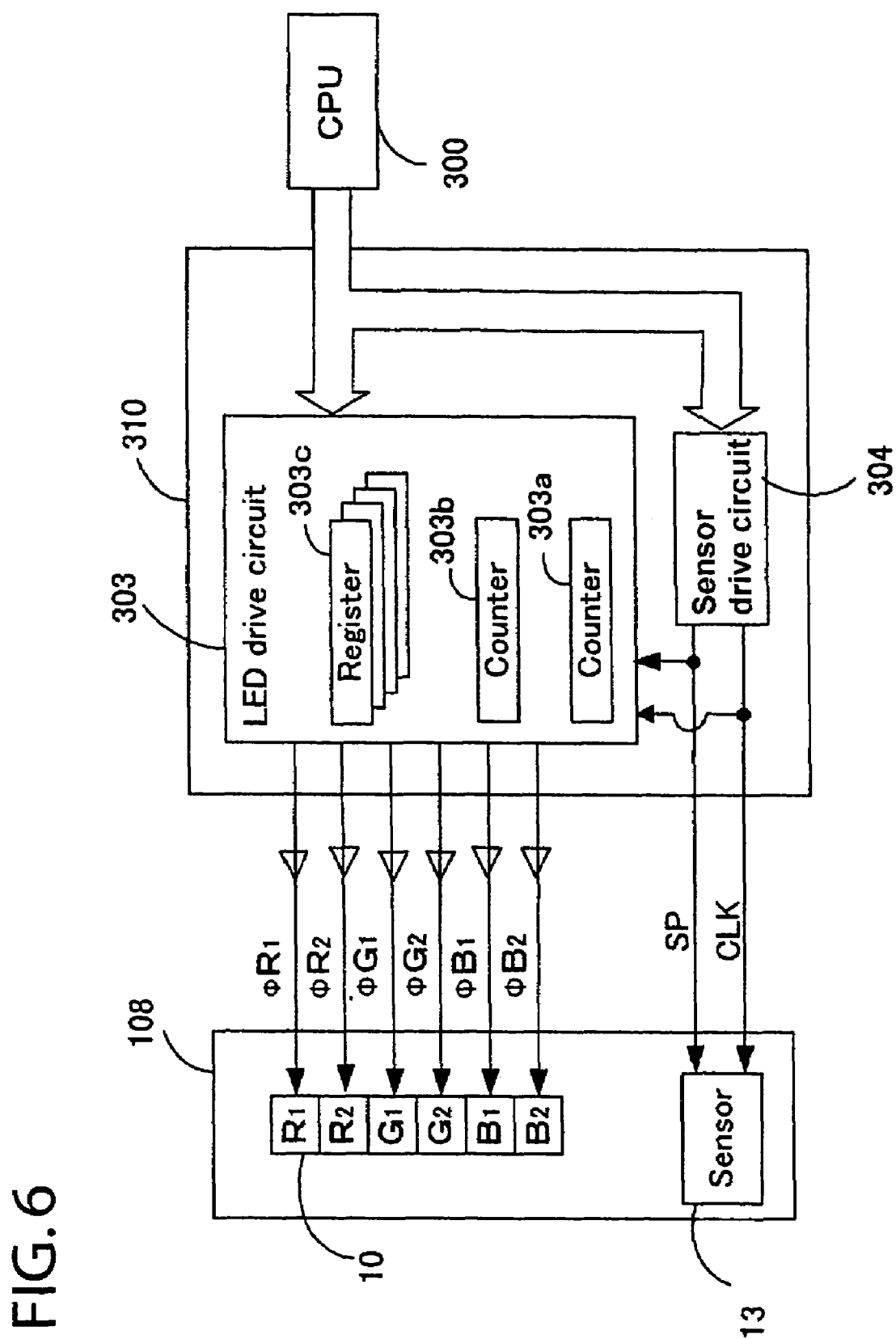
FIG. 6 is a block diagram showing a detail of a sensor unit drive circuit shown in FIG. 5.

FIG. 6 is diagram showing a detail of the sensor unit drive circuit shown in FIG. 5. The sensor unit drive circuit 310 comprises an LED drive circuit 303 and a sensor drive circuit 304. The sensor drive circuit 304 outputs clock CLK and a start pulse SP generated at a cycle according to the reading mode to the sensor 13 and the LED drive circuit 303. Further, the LED drive circuit 303 comprises a counter 303a for counting the clock CLK upon the input of the start pulse SP; a counter 303b for counting the clock CLK counted by the counter 303a at every 8 cycles; and a register 303c for setting a time of lighting of the LEDs (i.e., all the LEDs from R1 through B2) turned on at the start pulse SP.

Figure 7:
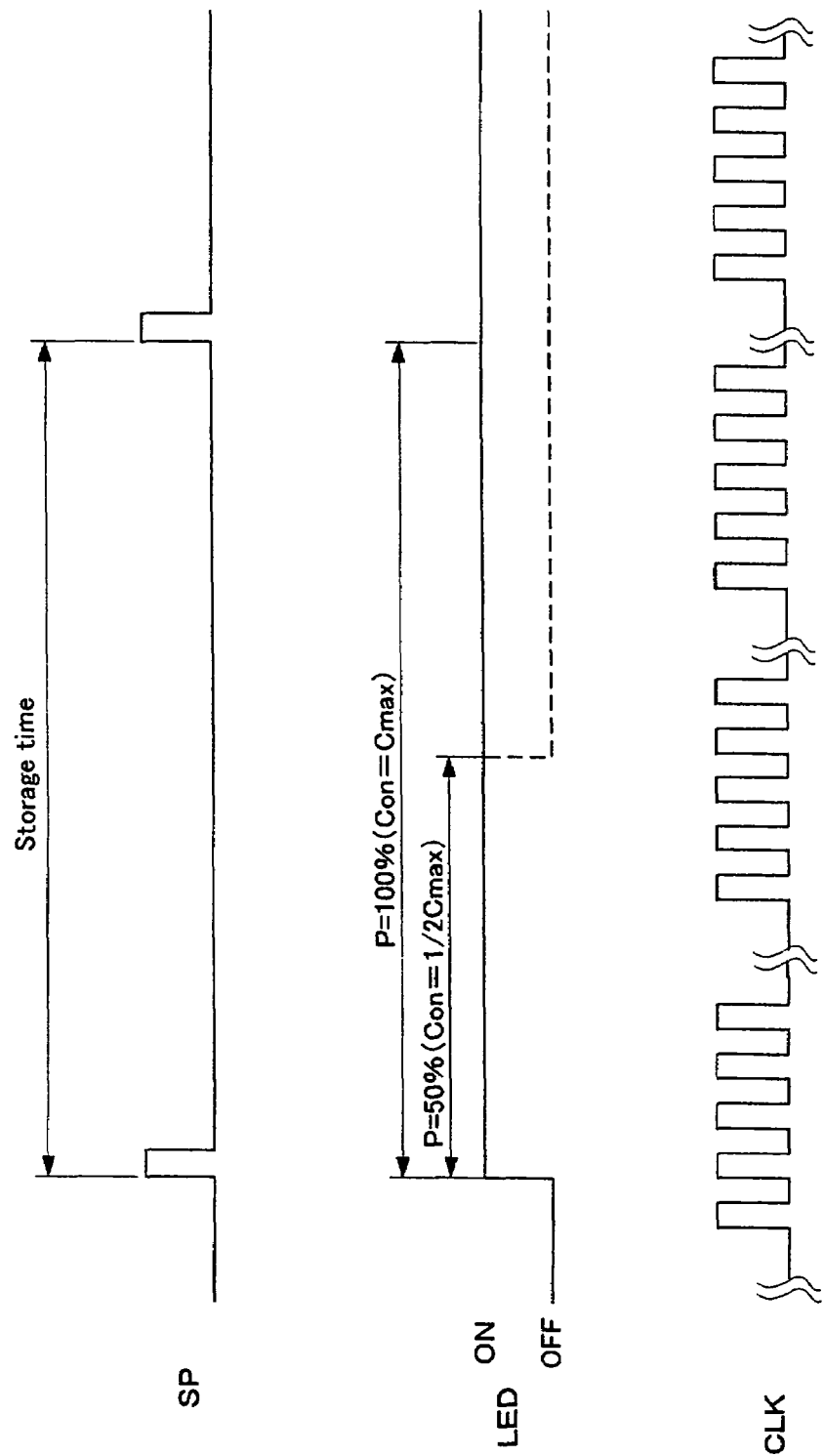
FIG. 7 is a chart for explaining an output ratio P of a light source (LED)

As shown in FIG. 7, the LED is lighted simultaneously with the input of the start pulse SP, and the counter 303a starts counting the clock CLK simultaneously. The counter 303b counts the clocks CLK,. which is also counted by the counter 303a, at every 8 cycles. When the count reaches the number of the lighting clock Con set in the register 303c, the LED is turned off. In the present embodiment, the six LEDs are provided, and the registers 303c have six systems to control the time of the lighting independently. For simplicity, just one of the LEDs will be explained.

In the present embodiment, when a value of (storage time T)/(8 cycles of the clock CLK) becomes the maximum number of the lighting clock (Cmax) within the storage time, the LEDs are turned on. Also, it is possible to set the number of the lighting clocks Con in the register 303c ranging from 0 to Cmax.

FIG. 7 is a chart for explaining an output ratio P of a light source (LED). An output ratio P (lighting duration Ton of LED/Storage time T) can be expressed as a ratio of the number of the lighting clocks Con set in the register 303c and the maximum number of lighting clock Cmax (Number of the lighting clock Con/Maximum number of the lighting clock Cmax). That is, when Con is equal to Cmax, the output ratio P becomes Con/Cmax=1 (100%), and the lighting duration Ton of the LEDs is equal to the storage time T. When the number of lighting clock Con is equal to ½ Cmax, the output ratio P is (Cmax/2)/Cmax=0.5 (50%), and Ton (lighting duration of LED) is equal to ½ of the storage time T. Further, when the number of lighting clock (Con) is 0 (Minimum number of lighting clock), the LED is not turned on.

Figure 8:
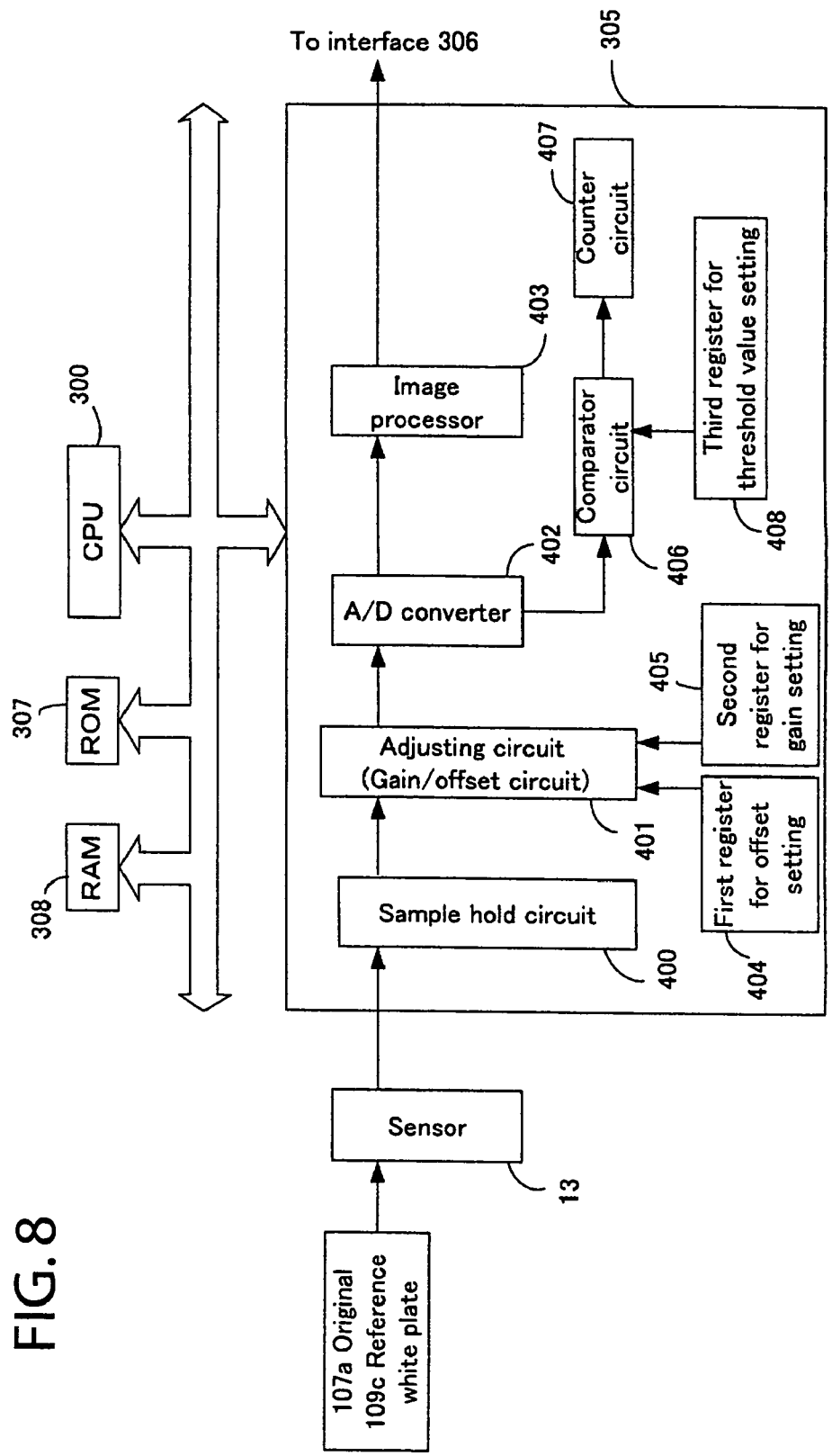
FIG. 8 is a block diagram showing an internal configuration of a signal processor shown in FIG. 5.

FIG. 8 is a block diagram showing an internal configuration of a signal processor shown in FIG. 5. Light reflected from the original or the reference white plate 109c is converted to the analog signal by the sensor 13, and inputted as the analog image signal to the signal processor 305. The signal processor 305 comprises a sample hold circuit 400 for holding the analog image signal; an adjusting circuit 401 (adjusting means) for performing the gain processing (amplification) and the offset processing of the analog signal; the A/D converter 402 for converting the analog image signal to the digital image signal; and the image processor 403 for applying the image processing such as the shading or the γ correction to the digital image signal.

The adjusting circuit is composed of, for example, an operational amplifier circuit, and is connected with a first register 404 for setting the offset value and a second register 405 for setting the gain value. The adjusting circuit applies the offset processing to the analog image signal inputted through the sample hold circuit 400 according to the offset value, and also applies the gain processing according to the gain value. Incidentally, the offset processing is a process of addition or deduction of a certain value to or from each of the analog signals outputted from a plurality of the photoelectric conversion elements constituting the optical scanner. Further, the gain processing is a process of amplifying each analog signal outputted from a plurality of the photoelectric conversion elements constituting the optical scanner according to the value of the gain.

The A/D converter is designed to have a resolvable input voltage range of, for example, DC 0 to 5 V, and a resolution of 10 bits (0 to 1023). Further, the A/D converter 402 is connected with a comparator circuit 406 (comparison means), and the comparator circuit 406 is connected with a counter circuit 407 (counting means). In the comparator circuit 406, when the offset adjustment for obtaining the offset value and the gain adjustment for obtaining the predetermined gain value are performed, the digital image data outputted from the A/D converter 402 is compared with a threshold value (described later) set in the third register 408 for each pixel. In the counter circuit 407, the number of pixels having values smaller or larger than the threshold value in the comparator circuit 406 is counted.

The offset value can be set on the basis of 8 bits (0 to 255), while the gain value can be set on the basis of 6 bits (0 to 63). When the set value of the gain is 0, the amplification factor is about 1, and when the value of the gain is set to 255, the amplification factor becomes about 10 times.

FIGS. 9(a) to 9(c) are charts showing various reading modes and timing charts thereof. As described above, the printer 2 is capable of setting the resolution (600/300 dpi) and making color/monochrome selection. For instance, 5 levels of the reading modes are available at the resolution of 600 dpi, and 5 levels of the reading modes are available at the resolution of 300 dpi, i.e. total 10 levels of the reading modes. More specifically, the reading modes are available corresponding to the lighting patterns, namely, (1) sequential lighting of the color LEDs, (2) lighting of monochrome and all the color LEDs, (3) lighting of the monochrome and the red LEDs, (4) lighting of monochrome and the green LEDs (G1 and G2), and (5) lighting of the monochrome and the blue LEDs (B1 and B2). The reading mode for lighting the monochrome and all the color LEDs such as the case (2) is available for preventing so-called drop-out color, in which some of colors are not read depending on the color of the light source.

The modes of lighting monochrome and the single color LEDs, such as the lighting modes of (3) through (5), are used for reading an original having a white background and black letters with a partial marking of a red fluorescent marker. When only the red LEDs (R1 and R2) are turned on to read the original, the portion with the marking of the red marker has the output value equivalent to that of the white background and is not detected, and only the letter in black is detected at a low output value. Accordingly, the mode of lighting monochrome and the single color LED is used for not reading specific color as a drop-out color.

As shown in FIG. 9(a), in the mode (1) of sequential lighting of the color LEDs, the LEDs 10 having each color, i.e. R (R1, R2), G (G1, G2) and B (B1, B2), are sequentially lighted during the reading of one line within the storage time T, and the sensor 13 is synchronized to move, so that the image sensor unit 108 moves to scan in a sub-scanning direction. As shown in FIG. 9(b), in the mode (2) of lighting monochrome and the all color LEDs, the LEDs 10, i.e. R1, R2, G1, G2, B1 and B2, are lighted simultaneously, and the sensor 13 scans one line within the storage time T. As shown in FIG. 9(c), in the modes (3) to (5) of lighting monochrome and the single color LEDs, the single color LEDs 10 (in the case of the red color, only R1 and R2 are lighted) having each color, i.e. R (R1, R2), G (G1, G2) and B (B1, B2), the sensor 13 scans one line within the storage time T.

Figure 10:
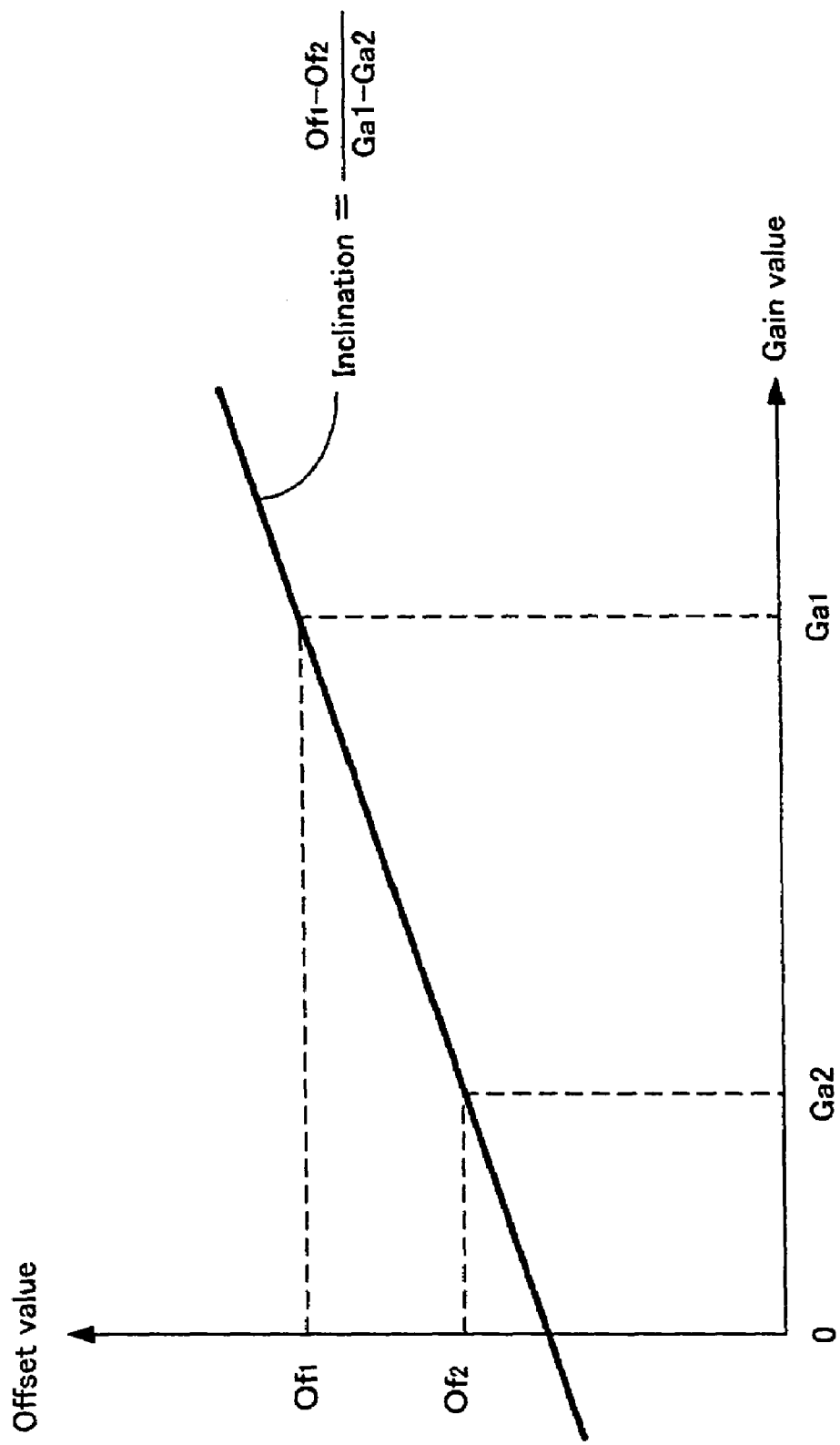
FIG. 10 is a graph for explaining a correlation between an offset value and a gain value.
Figure 11:
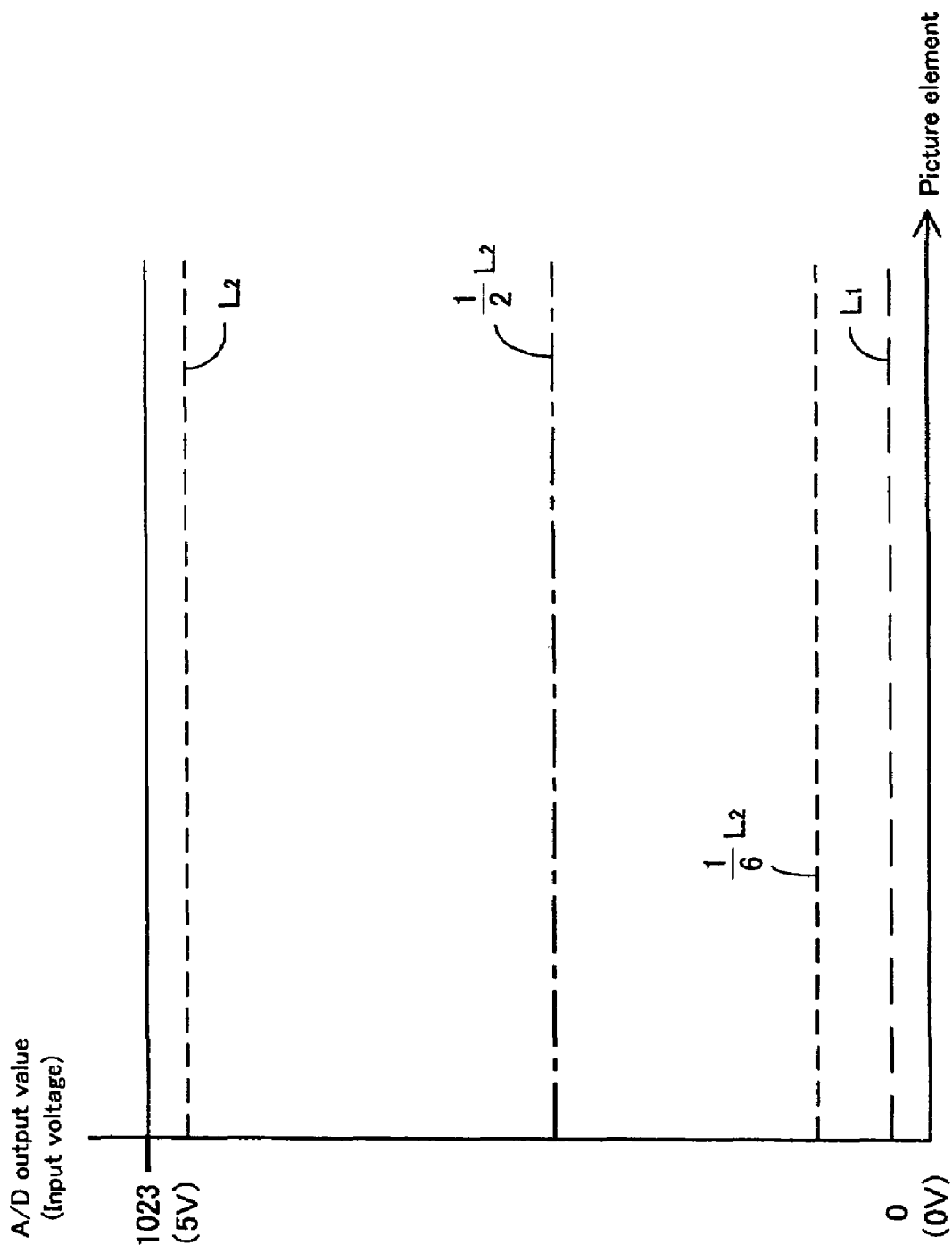
FIG. 11 is a graph for explaining an input voltage and resolution of an A/D converter, and threshold values for a gain adjustment and offset adjustment.

FIG. 10 is a graph for explaining a correlation between the offset value and the gain value obtained when the image reading apparatus is turned on. FIG. 11 is a graph for explaining an input voltage and resolution of the A/D converter 402. As shown in FIG. 10, when the reference white plate 109c is scanned while the LED 10 is lighted, the digital signal of each pixel outputted from the A/D converter 402 has a gain value close to the highest level of the input signal to the A/D converter. When the reading is performed while the LED 10 is turned off, the digital signal for each pixel outputted from the A/D converter 402 has an offset value close to 0 or the lowest level of the input signal to the A/D converter. In such a case, the gain value and the offset value have a linear relationship, and can be expressed by a linear equation wherein the gain is a variable. Accordingly, when the offset values at two points corresponding to the gain values are obtained, it is possible to calculate the offset value corresponding to an arbitrary gain value by using the following approximate formula (relational formula). The offset value Of (approximate value) can be given by:

$$Of = ((Of1-Of2)/(Ga1-Ga2))*Ga + (Ga1*Of2-Ga2*Of1)/(Ga1-Ga2),$$

where Of1 is a first offset value and Of2 is a second offset value.

The approximate formula F (relational formula) is stored in ROM 307 (refer to FIG. 5; memory means). In the above approximate formula F, when the slope is represented by A and the intercept is represented by B, the formula is given by Of= A*Ga+B, where A=(Of1−Of2)/(Ga1−Ga2), and B=(Ga1*Of2−Ga2*Of1)/(Ga1−Ga2). The coefficient A and constant B in the approximate formulas A change depending on a condition of the light source. Accordingly, if the coefficient and the constant are obtained for each reading mode before reading the original, it is possible to obtain the offset value relative to the gain value in the stable condition.

In the present embodiment, the slope A is obtained using the offset value Of1 when the first gain value Ga 1 is the maximum gain value Ga(max) 63 (amplification factor: about 10) and the offset value Of2 when the second gain value Ga 2 is the minimum gain value Ga(min) 0. The fixed value (63) (first gain value Ga1−second gain value Ga2) is stored in the ROM 307 in advance. The intercept B is equal to Of2.

Figure 12:
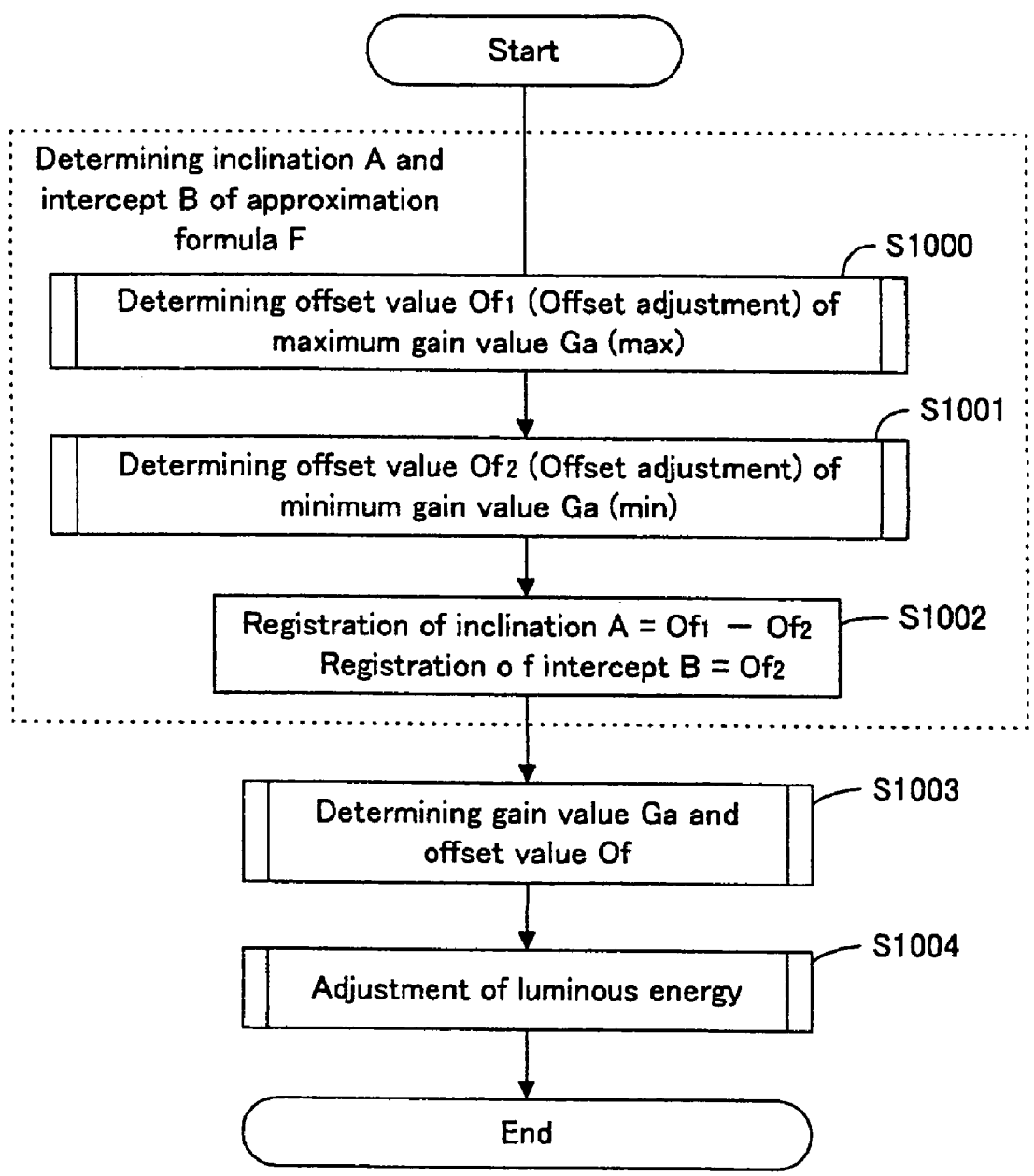
FIG. 12 is a flowchart of the whole process of the image reading apparatus before reading an image.

FIG. 12 is a flowchart of the whole process of the image reading apparatus before reading an image when each of the reading modes is selected. When an operator turns on the printer 2 by pressing the power switch thereof, the image reading apparatus 1 is also turned on. Then, the operator specifies the reading mode by using the operation buttons 202a and 202b, and subsequently presses the copying button 204a to start the pre-reading process, in which the gain value G and the offset value Of are determined according to the specified reading mode before reading, and the luminous quantity of the LED to be used is adjusted. The processes in the flowcharts shown in FIGS. 12 to 17 are executed by the CPU 300 according to the control program stored in the ROM 307.

As indicated by the hidden line in FIG. 12, in the pre-reading process, the slope A and the intercept B are determined as the coefficients of the approximate formula F. In this process, the offset is adjusted to obtain the offset value Of1 at the maximum gain value Ga(max) and the offset value Of2 at the minimum gain value Ga(min) (Steps S1000 and S1001), thereby obtaining a difference (Of1−Of2) (Step S1002). In this way, the slope A of the approximate formula F is determined. At the same time, the intercept B (Of2) is determined to establish the approximate formula F. Accordingly, it is possible to obtain the offset value corresponding to the gain value using each gain value with the approximate formula.

The offset value Of corresponding to the gain value Ga is obtained with the approximate formula F, and the gain is adjusted (Step S1003). Lastly, the luminous quantity of each LED is adjusted (Step S1004) to complete the pre-reading process. In the present embodiment, the mode (3) of lighting monochrome and the red LEDs (R1 and R2), in which only the red LEDs (R1, R2) are lighted, will be explained as an example.

Figure 13:
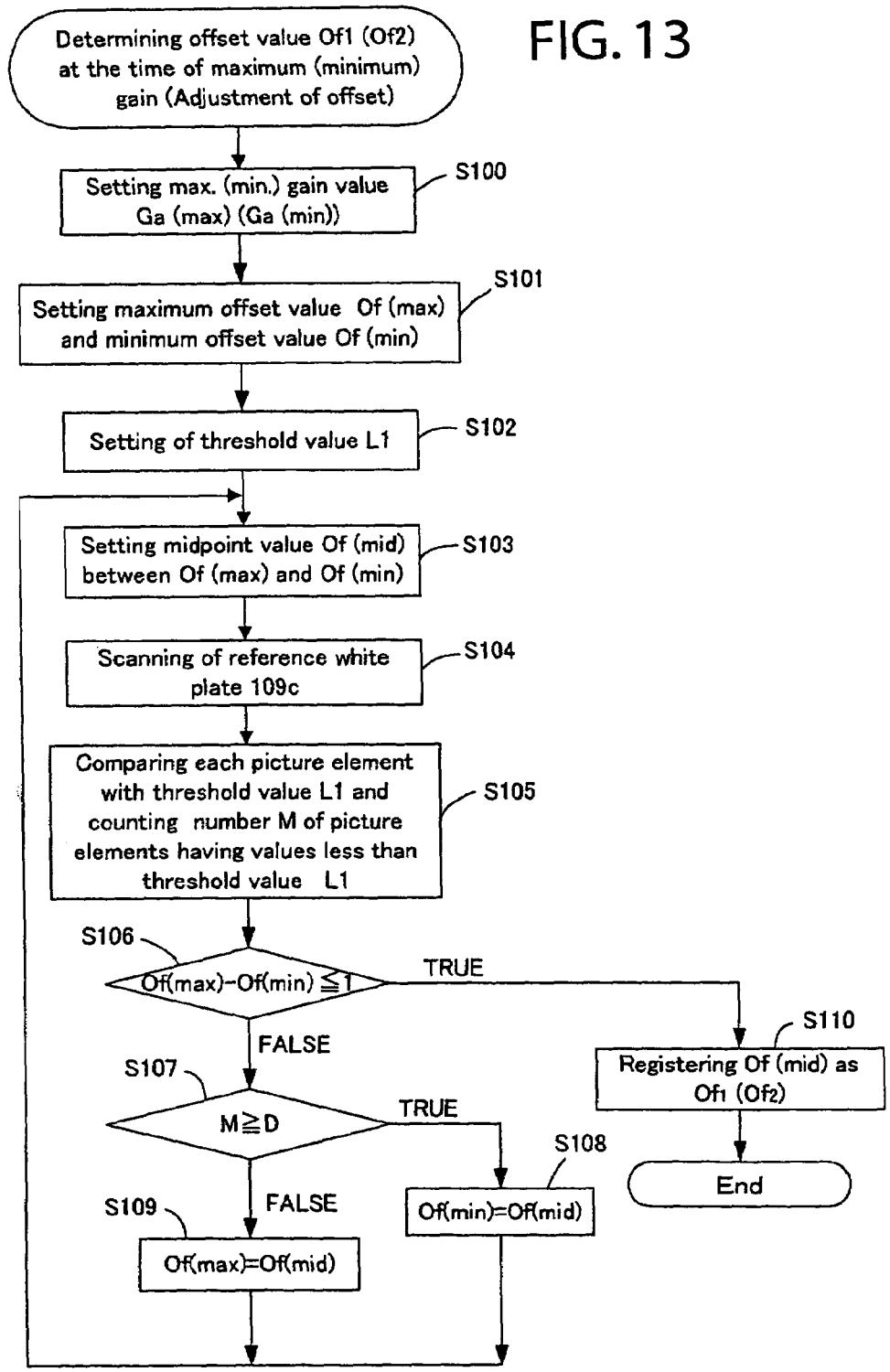
FIG. 13 is a flowchart of a process of obtaining an offset value Of1 corresponding to a maximum gain value Ga(max) and an offset value Of2 corresponding to a minimum gain value Ga(min)

FIG. 13 is a flowchart of a process of obtaining the offset value Of1 corresponding to the maximum gain value Ga(max) and the offset value Of2 corresponding to the minimum gain value Ga(min). In step S100, the maximum gain value Ga(max) is set in the second register 405 as the first gain value. In the present embodiment, the gain value is set to 63 since the gain value is 6 bits (0 through 63), and the amplification factor becomes 10. In step S101, the maximum offset value Of(max) and the minimum offset value Of(min) are set. In the present embodiment, since the offset value is 8 bits (0 to 255), it is set that Of(max)= 255 and Of(min)=0. Further, in step S102, the offset adjusting threshold value L1 is set in the third register 408.

As shown in FIG. 11, in consideration of a variation in the output of the sensor 13 for each pixel, the threshold value L1 is set to a value such that, in a case that the scanning is made while the light source is turned off, the signal for each pixel outputted from the A/D converter 402 is not less than the minimum output value 0 of the A/D converter 402, and is close to the minimum output value 0. That is, the voltage of each pixel input to the A/D converter is not less than the minimum input voltage (minimum input level) 0 V, and is close to the minimum input value 0. In the present embodiment, the threshold value L1 is set to be the output value 50 of the A/D converter 402 (10 bits), which corresponds to about 245 mV close to the minimum input level 0 V of the A/D converter 402.

In step S103, an intermediate offset value Of(mid) between the maximum offset value Of(max) and the minimum offset value Of(min) is set in the first register 404. Next, in step S104, the motor 309 is driven through the motor drive circuit 304 to move the image sensor unit 108 under the reference white plate 109c. With the LEDs 10 turned off, the sensor 13 is driven to scan the reference white plate 109c for one line. The analog image signal for each pixel outputted from the sensor 13 by the scanning operation is inputted per one pixel to the adjusting circuit 401 through the sample hold circuit 400. In the adjusting circuit 401, the analog image signal undergoes the gain processing (amplification) with the maximum gain value Ga(max) and the offset processing (level shift) with the offset value Of(mid), and is converted to the digital signal through the A/D conversion circuit 402 to be sequentially inputted to the comparator circuit 406.

In the comparator circuit 406, the threshold value L1 for adjusting the offset value set in the third register 408 is compared with the value of the analog signal for each pixel. The number M of the pixels having values less than the threshold value L1 for the adjustment of the offset is counted in the pixel number counting circuit 407 (Step S105). Next, the difference between the maximum offset value Of(max) and the minimum offset value Of(min), Of(max)−Of(min), is obtained, and it is determined whether the difference is less than 1 or not (Step S106). When the difference is less than 1, the offset value Of(mid) is stored as the first offset value Of1 in the specified area in RAM 308 (Step S110). When Of(max)−Of(min) is larger than 1, the number M of the pixels obtained in step S105 is compared with the predetermined value D (40 relative to about 2,000 of the photoelectric conversion elements in the present embodiment) stored in the ROM 307 (step S107). When the number M of the pixels is larger than the predetermined value D, the minimum offset value Of(min) is re-written to the offset value Of(mid), and the process returns to the step S103 (Step S108). In step S107, when the number M of the pixels is less than D, the maximum offset value Of(max) is re-written to the offset value Of (mid) by the CPU 300, and the process returns to step S103 (Step S109). In this way, the processes in step S103 through step S109 are repeated until Of(max) −Of(min) becomes less than 1 to obtain the offset value Of1 corresponding to the maximum gain value.

As discussed previously, the offset value is varied by using the dichotomizing search method. When the values of the 40 pixels of the 2,000 photoelectric conversion elements become larger than the threshold value L1, that is, when the analog signal outputted from the optical scanner becomes close to the threshold value L1 or first level (i.e., when the values of the most of the analog signals outputted from each photoelectric conversion element become larger than the threshold value L1 and close to the threshold value L1), the offset value is set to be the first offset value Of1.

Next, the offset value Of2 as the second gain value at the minimum gain value Ga(min) is obtained (Step S1001 in FIG. 12). Similar to the process of obtaining the offset value Of1 corresponding to the maximum gain value Ga(max), the offset value Of2 corresponding to the minimum gain value Ga(min) is obtained. More particularly, the minimum gain value Ga(min) (0 in the present embodiment) is set in the second register 405 (step S100), and the processes of the step S102 through step S109 are executed to obtain the second offset value Of2 to be stored in RAM 308 (step S110).

Then, the difference between the first offset value Of1 and the second offset value Of2, Of1−Of2, is obtained and stored in the specified area of the RAM 308. The second offset value Of2 as the intercept B of the approximate formula is stored in a specific area of the RAM 308 (Step S1002 in FIG. 12). With the above steps, the approximate formula for the present reading mode can be established. Next, the gain value Ga (specific gain value) and the offset value Of (specific offset value) for the present reading mode are obtained by using the approximate formula established in step S1003.

Figure 14:
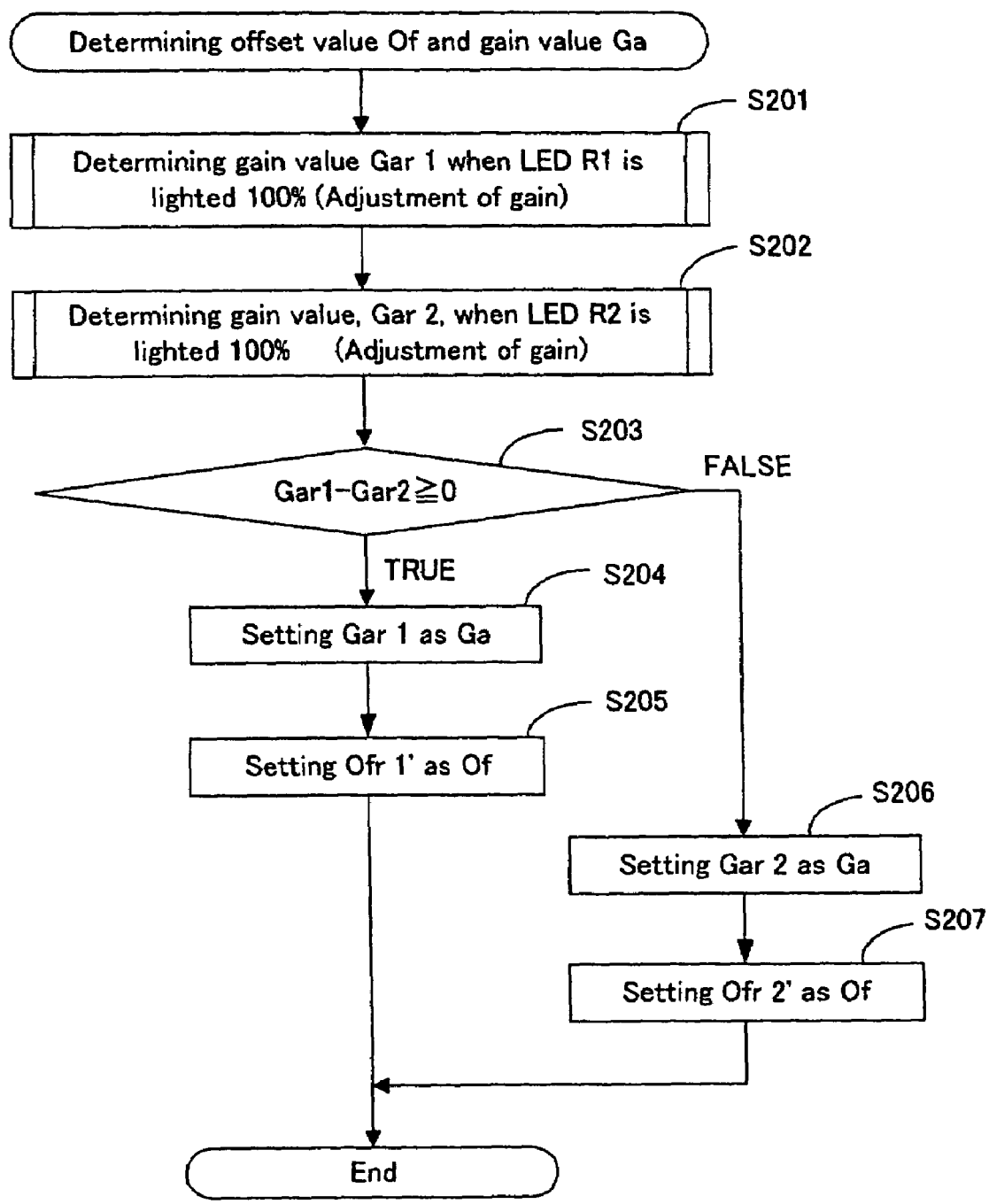

FIG. 14 is a flowchart of a process of obtaining the gain value Ga and the offset value Of. In obtaining the gain value Ga and the offset value Of, first, a gain value Gar1 when only R1, one of the red LEDs, is lighted at the output ratio of 100% is obtained (step S201). Next, a gain value Gar2 when only R2, another red LED, is lighted at the output ratio of 100% is obtained (step S202). Next, the obtained gain values, Gar1 and Gar2, are compared (step S203), and the larger gain value is set to be the gain value Ga (step S204 or step 206), while the corresponding offset value is set as Of (step S205 or S207). Incidentally, in the mode of lighting monochrome and the all LEDs (6 LEDs), the gain values when each of the LEDs (R1 through B2) is lighted at the output ratio of 100% are obtained respectively, and the largest value among the gain values is set as the gain value Ga.

Figure 17:
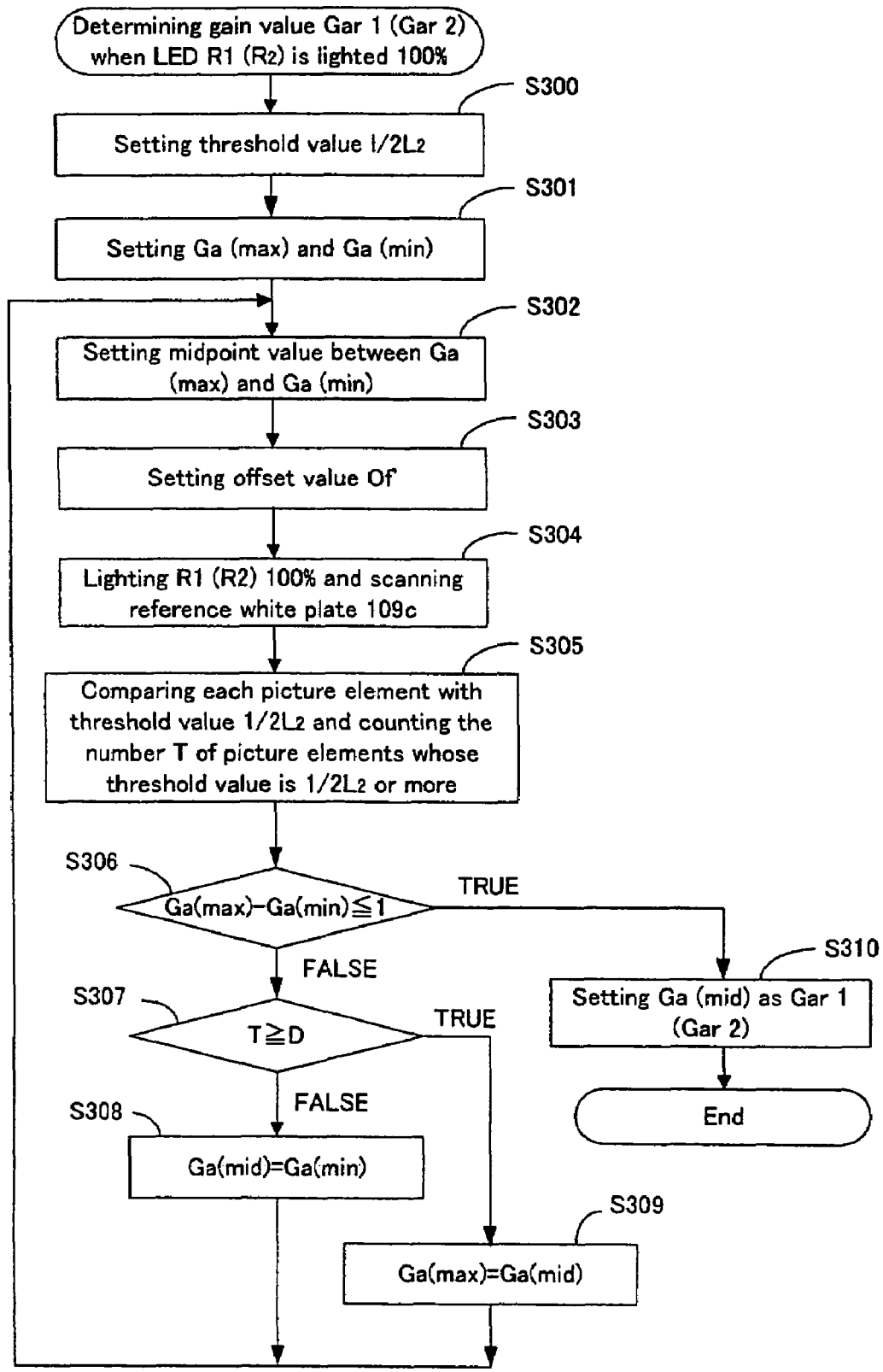
FIG. 17 is a flowchart of a process for obtaining the gain value Ga1 (Ga2) when the LED R1 (R2) has an output ratio of 100%.

FIG. 17 shows a flowchart of a process of obtaining the gain value Gar1 (Gar2), wherein only the LED R1 (R2) is lighted at the output ratio of 100% and the gain is adjusted by varying the gain value with the dichotomizing search method to obtain the gain value Gar1. First, in step S300, the threshold value ½*L2, i.e. a half of the gain adjusting threshold value L2, is set in the third register 408. As shown in FIG. 11, in consideration of a variation in the output of the sensor 13 for each pixel, the threshold value L2 is set to be a value such that, in a case that the scanning of the white reference plate 109c is made while R1 and R2 are turned on, the analog signal from the A/D converter 402 is less than the maximum output value 1032 of the A/D converter 402, and is close to the maximum output value 1032. That is, the analog signal input to the A/D converter is less than the maximum input voltage (maximum input level) 5 V, and is close to the maximum input value. In the present embodiment, the threshold value L2 is set to be the output value 973 relative to the maximum output value 1023 of the A/D converter 402, which corresponds to about 4.8 V close to the maximum input level 5 V of the A/D converter 402.

In the present reading mode, the R1 and R2 are turned on at the same time. Accordingly, the input voltage and the output value for each of the R1 and R2 become a half of those at the time when the two LEDs are lighted, and thus the threshold value is set to be a half of L2 or ½*L2. Incidentally, in the mode of lighting monochrome and all the LEDs (six LEDs), the input voltage and the output value of the A/D converter 402 for each LED is ⅙ of those of the full lighting, so that the threshold value is set to be ⅙ of L2, or ⅙*L2.

In step S301, the maximum gain value Ga(max) and the minimum gain value Ga(min) are set. In the present embodiment, the gain value is 6 bits (0 to 63), so that the settings are Ga(max)=63 and Ga(min)=0. In step S302, the intermediate gain value Ga(mid) between the maximum gain value Ga(max) and the minimum gain value Ga(min) is set in the second register 405. In step S303, the offset value Of' at the gain value Ga(mid) is obtained by using the approximate formula F and is set in the first register 404.

Next, in step S304, the motor 309 is driven through the motor drive circuit 304 to move the image sensor unit 108 to under the reference white plate 109c. The maximum number of lighting clocks Cmax is set with the register 303c in the LED drive circuit 303. With only R1 lighted at the output ratio of 100%, the sensor 13 is driven to scan the reference white plate 109c for one line. With this reading operation, the analog image signal for each pixel, outputted from the sensor 13 is inputted to the adjusting circuit 401 through the sample hold circuit 400. Subsequent to the offset processing (level shift) by the offset value Of' and the gain processing (amplification) by the gain value Ga(mid) in the adjusting circuit, the analog image signal is converted to the digital signal to be sequentially inputted to the comparator circuit 406. In the comparator circuit 406, each pixel is compared with the threshold value ½*L2, and the number T of the pixels having values larger than the threshold value ½*L2 is counted in the counter circuit 407 (step S305).

Next, the difference between the maximum gain value Ga(max) and the minimum gain value Ga(min), Ga(max)−Ga(min), is obtained to determine whether the difference is less than 1 or not (step S306). When the difference is less than 1, the gain value Ga (mid) is stored in the specified area of the RAM 308 as the gain value Ga1 (step S310). When Ga(max)−Ga(min) is larger than 1, the number T of the pixels obtained in step S305 is compared with the s predetermined value D (40 in the present embodiment) stored in the ROM 307. When the number T of the pixels is larger than the predetermined value D, the maximum gain value Ga(max) is re-written to the gain value Ga (mid), and the process returns to step S302 (step S309). When the number T of the pixels is less than the predetermined value D in step S307, the minimum gain value Ga(min) is re-written to the gain value Ga(mid), and the process returns to the step S302 (step S309).

As described above, the processes in step S302 through step S309 are repeated until Ga(max)−Ga(min) becomes less than 1 to obtain the gain value Gar1. In this way, the steps are repeated until the specific gain value Gar1 is obtained by re-writing the gain value in step S302. The offset value Of in step S303 is obtained from the offset value corresponding to the gain value set in step S302 by using the approximate formula F.

As discussed above, the gain value is varied by using the dichotomizing search method. When the values of the 40 pixels out of 2,000 photoelectric conversion elements have become close to the threshold value ½*L2 (second level), that is, most of the values of the analog signal outputted from each photoelectric conversion element is less than the threshold value ½*L2 and close to ½*L2, the gain value is obtained as the first gain value Gar1.

Next, the gain value Gar2 when only the other LED R2 is lighted at the output ratio of 100% is obtained in the process similar to that of obtaining the gain value Gar1. That is, the gain value is obtained by executing the processes in steps S300 through S310 with only R2 lighted at the output ratio of 100% (step S202 in FIG. 14).

In the step S203 shown in FIG. 14, the difference between the gain value Gar1 and the gain value Gar2, Gar1−Gar2, is obtained (step S203). When the difference is larger than 0, the Gar1 is stored in the RAM 307 as the gain value according to the present reading mode (specific gain value) (step S204). The offset value Ofr1' corresponding to the gain value Gar1 is obtained by using the approximate formula F in step S303, and this value is stored in the RAM 307 as the offset value Of (specific offset value) (step S205). When the gain value is less than 0 (i.e., negative) in step S203, Gar2 is stored in RAM 307 as the gain value for the present reading mode (step S206). The offset value Ofr2' corresponding to the gain value Gar2 is obtained by using the approximate formula F in step S303 and is stored in the RAM 307 as the offset value Of, i.e., specific offset value (step S207).

As described above, the gain value at which the luminous quantity is smaller at the lighting of the 100% output ratio is adopted as the gain value Ga, and the corresponding offset value is adopted as the offset value Of.

Figure 15:
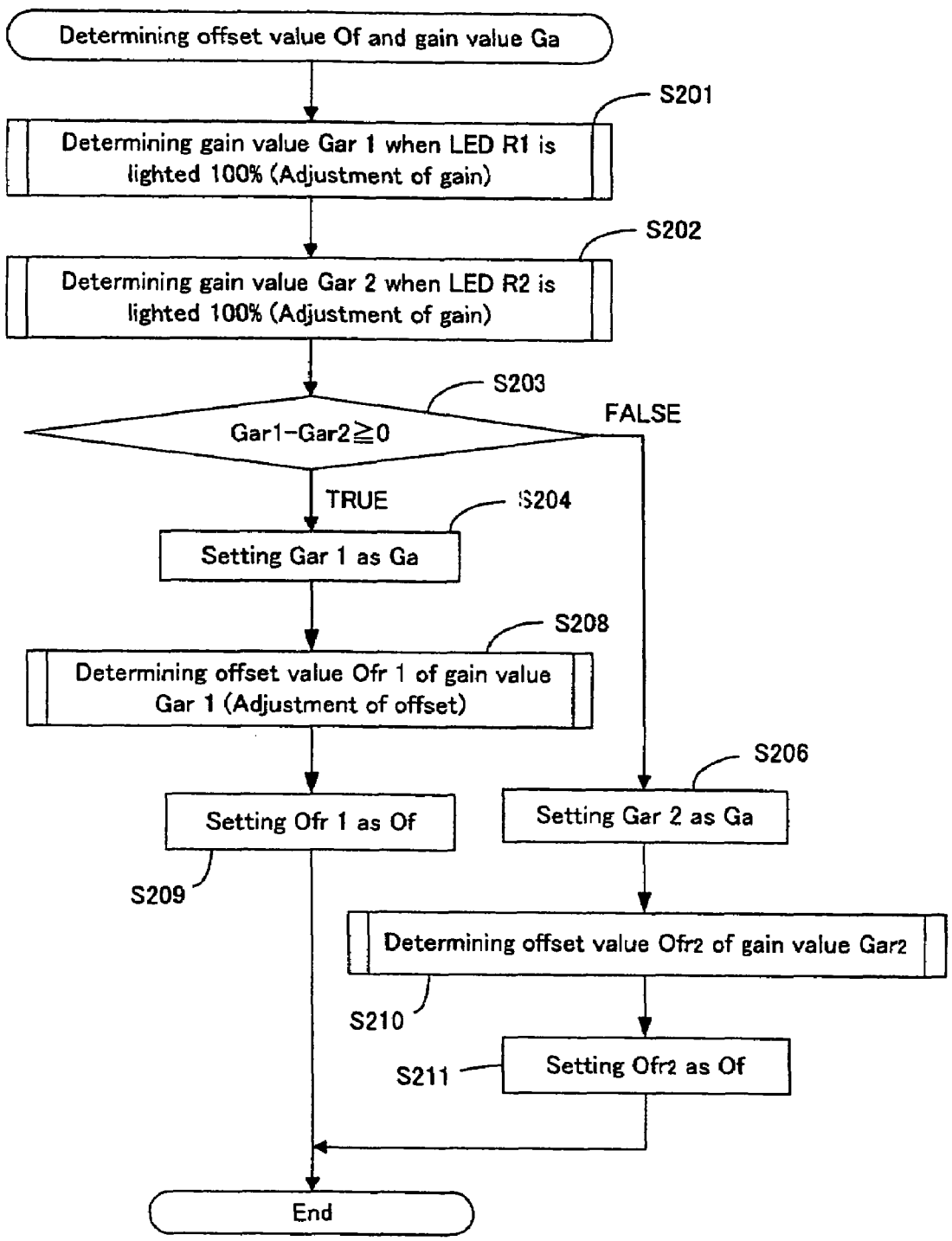
FIG. 15 is a flowchart of a process for obtaining the gain value Ga and the offset value Of according to another embodiment.

According to the second embodiment, as shown in FIG. 15, after setting Gar1 as Ga in step S204 or setting Gar2 as Ga in step S206, the exact offset value Ofr1 corresponding to the gain value Gar1 or the exact offset value Ofr2 corresponding to the gain value Gar2 is obtained through the offset adjustment (steps S208 and S210), and such an offset value Ofr1 or offset value Ofr2 may be set as the offset value Of (final offset value) (steps S209 and S211). Steps S211 through S204 shown in FIG. 15 are same as steps shown in FIG. 14.

The offset value Ofr1' corresponding to the gain value Gar1 and the offset value Ofr2' corresponding to the gain value Gar2 are obtained by using the approximate formula F in the step S303. Since the offset value Ofr1' is an approximate value, the offset values Ofr1 and Ofr2 are more appropriate offset values. The adjustments of the offset values in steps S208 and S210 are performed according to the process described in FIG. 13. In step S100, the gain value Ga (third gain value) obtained in step S204 or step S206 is set in the second register 405, and the offset value Ofr1 or Ofr2 (final offset value) is obtained by executing the processes in steps S102 through S110.

In the present embodiment, as shown in step 204 in FIG. 14, it is assumed that Gar1 and Ofr1' are set as the gain value Ga and the offset value Of, respectively. In the mode of lighting monochrome and the all LEDs (six LEDs), all the LEDs are lighted at the output ratio of 100% to obtain the respective gain values. The largest of all the gain values is set as the gain value Ga, while the corresponding offset value is set as the offset value. That is, among the six LEDs, a gain value of the LED having the lowest luminous quantity when the six LEDs are lighted at the output ratio of 100% is adopted as the gain value Ga.

Figure 16:
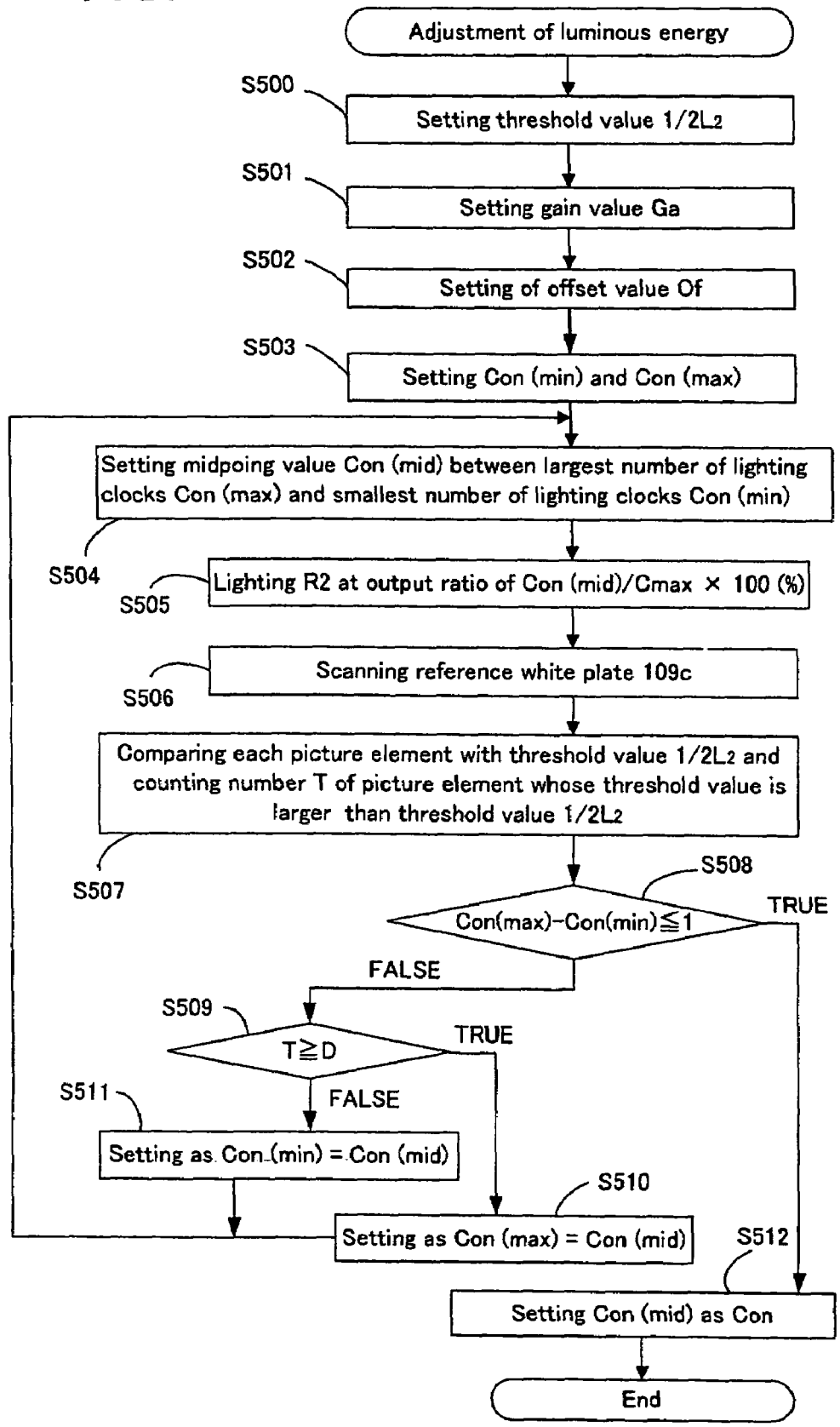
FIG. 16 is a flowchart of a process for adjusting a luminous quantity.

FIG. 16 is a flowchart of a process of adjusting the luminous quantity. The adjustment of the luminous quantity balance is designed to obtain an output ratio of R2 equivalent to the threshold value ½*L2 similar to R1 when the reference white plate is scanned by R2 having a luminous quantity larger than the other.

First, the threshold value ½*L2 is set in the third register 408 (step S500). The gain value Ga obtained in step S206 is set in the second register 405 (step S501). The offset value Of for the reading mode obtained in the step S206 is set in the first register 404 (step S502). In the step S503, the maximum number of the clock Con(max) for lighting and the minimum number of the clock Con(min) are set, respectively. In the present embodiment, Con(min)=0 and Con(max)=Cmax.

Next, in the step S504, the intermediate number of clock Con(mid) between the minimum number of lighting clock Con(min) and the maximum number of the lighting clocks Con(max) is set in the register 303c of the LED drive circuit 303. In the step S505, R2 is lighted at the output ratio of (Con(mid)/Con(max)×100%) to scan the reference white plate 109c by the sensor 13. The analog image signal outputted from the scanning sensor 13 is inputted one by one to the adjusting circuit 401 through the sample hold circuit 400. After the gain processing (amplification) by the gain value Ga and the offset processing (level shift) at the offset value Of, the analog signal is converted to the digital signal by the A/D conversion circuit 402 and inputted sequentially to the comparator circuit 406.

In the comparator circuit 406, the digital signal is compared with the threshold value ½*L2 set in the third register 408 for each pixel, and the number T of the pixels having values larger than the threshold value ½*L2 is counted in the counter circuit 407 (step S507).

Next, the difference between the maximum number of lighting clocks Con(max) and the minimum number of lighting clocks Con(min) (Con(max)−Con(min)) is obtained to determine whether the difference is less than 1 or not (step S508). When the difference is less than 1, the Con(mid) is stored in the specified area of the RAM 308 as the number of lighting clocks Con of R2 (step S512). When it is found that Con(max)−Con(min) is larger than 1 in step S508, the number of the pixels obtained in step S507 is compared-with the predetermined number D (40 in the present embodiment) stored in the ROM 307 (step S509). When the number T of the pixels is found to be larger than the predetermined value D, the Con(max) is re-written to Con(mid), and the process returns to step S504 (step S510). When the number T of the pixels is found to be less than the predetermined value D in step S509, Con(min) is re-written to Con(mid), and the process returns to step S504 (step S511).

As described above, the processes of step S504 through step S511 are repeated until Con(max)−Con(min) becomes less than 1 to obtain the number of lighting clocks (output ratio) of R2. Further, in the mode of lighting monochrome and the all LEDs (six LEDs), the similar luminous quantity adjustment is applied to the rest of the LEDs except one having the smallest luminous quantity. At this time, the threshold value is ⅙*L2. With the foregoing processes, the pre-reading process for the reading mode and monochrome/red color lighting mode is completed.

Figure 18:
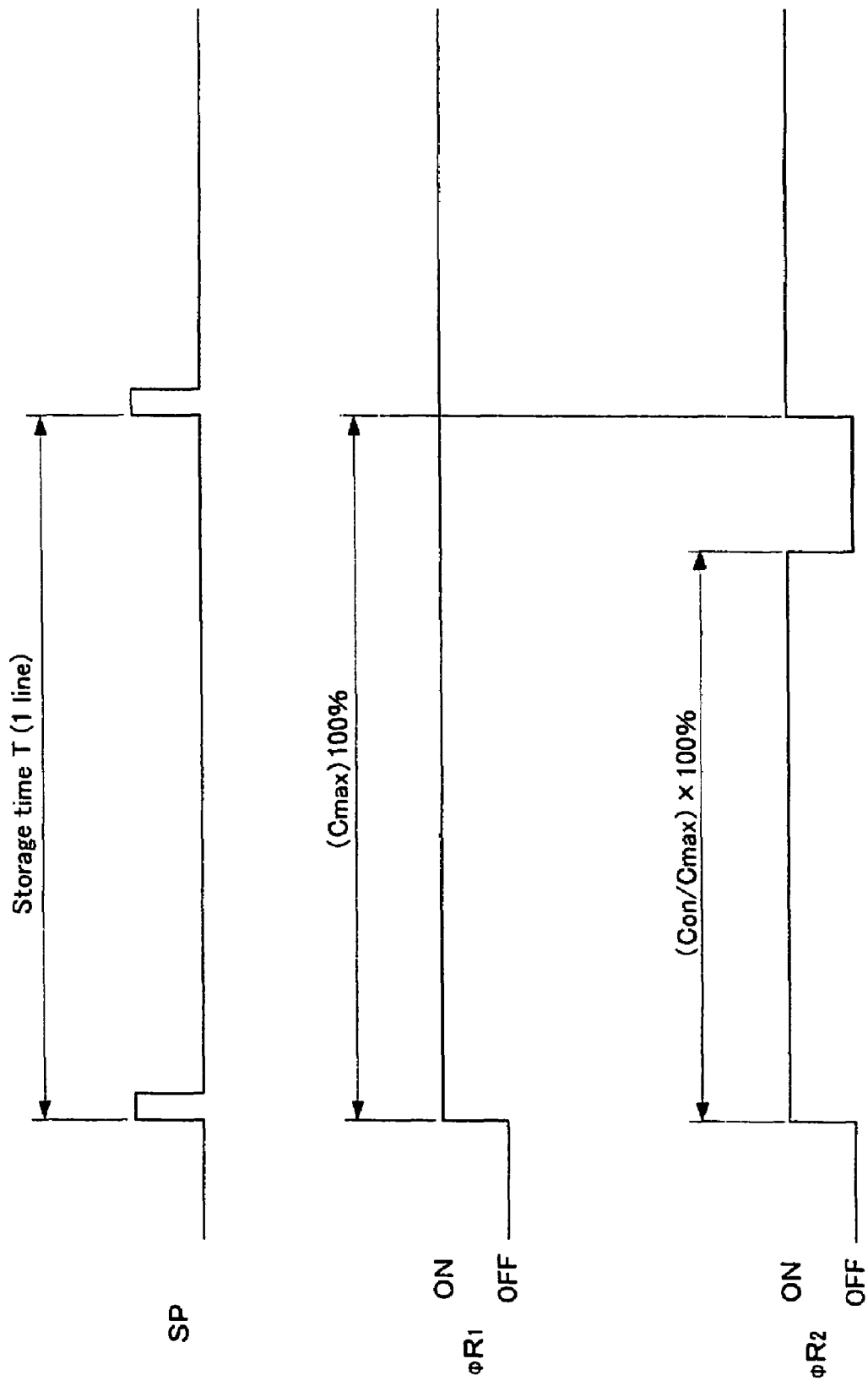
FIG. 18 is a graph showing various timing charts for a reading operation.
Figure 19:
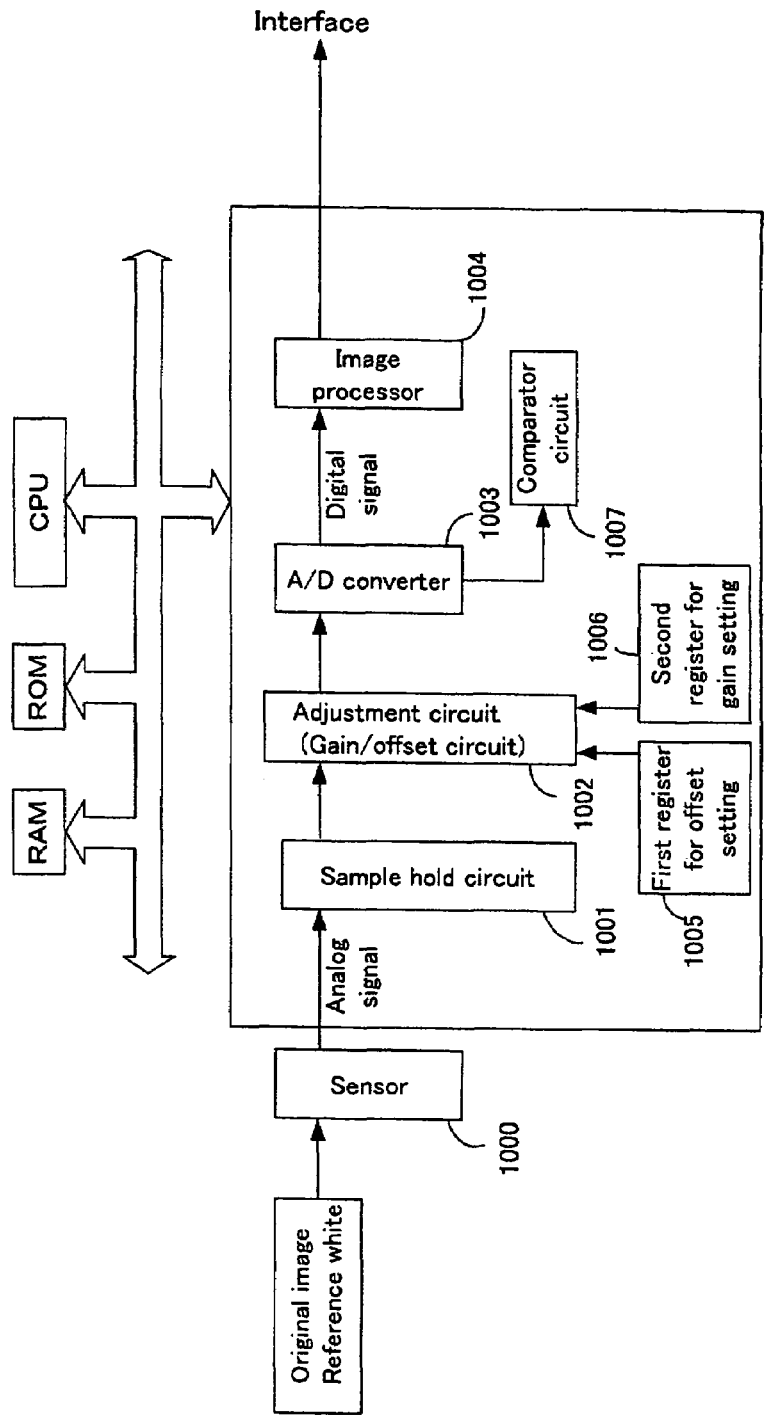
FIG. 19 is a diagram showing an operation of a signal processor of a conventional image reading apparatus.

FIG. 18 is a timing chart when the original is read. According to the conditions of the pre-scanning process, the original is read in the following sequence. The original is placed on the platen 107, and the operation button 202 of the operation unit 200 in the printer 2 is pressed to send the start command from the printer 2 to the image reading apparatus 1. After the offset value Of (third offset value or fourth offset value) is set with the first register 404 and the gain value Ga (the third gain value) is set with the register 405, as shown in FIG. 18, R1 is lighted at the output ratio of 100%, while the R2 is lighted at the output ratio (Con/Cmax)×100%. The image sensor unit 108 travels for a length of the original in the feeding direction (left and right directions in FIGS. 2(a) and 2(b)) to scan line by line to complete the reading operation.

The analog image signal for each pixel outputted one by one from the sensor 13 is inputted to the adjusting circuit 401 through the sample hold circuit 400, and is amplified and shifted in the level with the gain value Ga and the offset value Of. Then, the analog signal is converted to the digital signal by the A/D conversion circuit 402. After the image processing including the shading correction and the γ correction is performed, the digital signal is outputted to the printer 2 as the image data.

In the embodiments of the present invention, the image reading apparatus and the printer receiving the image data received from the image reading apparatus to print are explained. The present invention is also applicable to an image reading apparatus in general to be mounted on a copier machine, facsimile and the like.

In the embodiments of the present invention, after the user selects the reading mode, the pre-reading process is performed according to the selected mode. It is also possible to obtain conditions of all the modes as the initial processing immediately after the image reading apparatus is turned on.

As described above, in a conventional method, in the gain adjustment and offset adjustment for determining the gain value and offset value, the offset adjustment is performed each time the gain value changes, thereby taking a long time. In the present invention, the relational formula representing the correlation between the gain value and the offset value is provided. Accordingly, it is not necessary to adjust the offset value each time the gain value changes, thereby reducing time for the adjustment.

The disclosures of Japanese Patent Applications No. 2003-282215 and No. 2003-282216 are incorporated in the application.

While the invention has been explained with reference to the specific embodiments of the invention, the explanation is illustrative and the invention is limited only by the appended claims.

What is claimed is:

1. An image reading apparatus for reading an original, comprising:
    a light source for scanning the original,
    a photoelectric converter for converting light reflected from the original in each pixel to an analog signal,
    an A/D converter electrically connected to the photoelectric converter for converting the analog signal of each pixel from the photoelectric converter to a digital signal,
    adjusting means electrically connected between the photoelectric converter and the A/D converter for performing an offset processing and a gain processing of the analog signal from the photoelectric converter,
    a memory electrically connected to the adjusting means for storing a formula representing a correlation between an offset value to be used for the offset processing and a gain value to be used for the gain processing, and
    offset value calculating means for obtaining the offset value corresponding to the gain value to be used for the gain processing of the analog signal from the photoelectric converter using the formula stored in the memory when the original is scanned so that the gain value and the offset value corresponding to the gain value calculated by the formula in the memory as image data are obtained.

2. An image reading apparatus according to claim 1, wherein said formula is a linear function including a variable representing the gain value.

3. An image reading apparatus according to claim 1, wherein said offset value calculating means includes means for obtaining a coefficient of the formula representing the correlation between the gain value and the offset value.

4. A method of determining the gain value and the offset value for the image reading apparatus according to claim 1, comprising obtaining a coefficient of the formula representing the correlation between the gain value and the offset value, and obtaining the gain value and the offset value corresponding to the gain value by using the formula with the coefficient.

5. A method of determining a gain value and an offset value for an image reading apparatus with first and second registers, comprising:
    setting a first gain value in the second register of the image reading apparatus,
    obtaining a first offset value at which an analog signal outputted from a photoelectric converter of the image reading apparatus becomes a predetermined level when an original is scanned while a light source of the image reading apparatus is turned off,
    setting a second gain value in the second register of the image reading apparatus,
    obtaining a second offset value at which the analog signal from the photoelectric converter becomes the predetermined level when the original is scanned while the light source is turned off,
    determining a coefficient of a formula representing a correlation between the gain value and the offset value based on the first gain value, the first offset value, the second gain value, and the second offset value, and
    obtaining the gain value and the offset value corresponding to the gain value by using the formula with the coefficient.

6. A method of determining the offset value and the gain value according to claim 5, wherein said step of obtaining the gain value and the offset value includes repeating a cycle of setting the gain value in the second register, obtaining the offset value corresponding to the gain value by using the formula, setting the offset value in the first register, and scanning a reference member while the light source is turned on until the analog signal from the photoelectric converter becomes the predetermined level while changing the gain value and the offset value, so that the offset value corresponding to the predetermined gain value is obtained.

7. A method of determining the offset value and the gain value according to claim 5, further comprising, after the step of obtaining the gain value and the offset value, repeating a cycle of setting the gain value in the second register and scanning the reference member while the light source is turned on until the analog signal from the photoelectric converter becomes the predetermined level while changing the offset value in the first register, so that the offset value corresponding to the predetermined gain value is obtained.

8. A method of determining the offset value and the gain value according to claim 5, wherein said formula representing the correlation between the gain value and the offset value is a linear function wherein the gain value is a variable.

9. A method of determining the offset value and the gain value according to claim 5, wherein, in the step of setting the first gain value in the second register, said first gain value is a maximum gain value of adjusting means of the image reading apparatus.

10. A method of determining the offset value and the gain value according to claim 5, wherein, in the step of setting the second gain value in the second register, said second gain value is a maximum gain value of adjusting means of the image reading apparatus.

11. A method of determining the offset value and the gain value according to claim 5, wherein after setting the first gain value in the second register, the first offset value corresponding to the first gain value is obtained; after the first gain value is deleted from the second register, the second gain value is set in the second register; and the second offset value corresponding to the second gain value is obtained.

* * * * *